US012776748B2

(12) United States Patent
Yang et al.

(10) Patent No.: US 12,776,748 B2
(45) Date of Patent: Oct. 27, 2026

(54) DIGITALLY CONTROLLED OSCILLATOR WITH SEGMENTED VARACTOR BANK AND MULTIPLE-VOLTAGE LINEARIZATION, AND ASSOCIATED APPARATUS

(71) Applicant: MEDIATEK INC., Hsinchu City (TW)

(72) Inventors: Song-Yu Yang, Hsinchu City (TW); Huan-Jui Hu, Hsinchu City (TW); Yu-Wei Huang, Hsinchu City (TW); Chun-Wei Chang, Hsinchu City (TW); Wei-Hao Chiu, Hsinchu City (TW); Ang-Sheng Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 0 days.

(21) Appl. No.: 19/270,503

(22) Filed: Jul. 16, 2025

(65) Prior Publication Data

US 2026/0213711 A1 Jul. 23, 2026

Related U.S. Application Data

(60) Provisional application No. 63/747,951, filed on Jan. 22, 2025.

(51) Int. Cl.
*H03B 5/24* (2006.01)
*H03L 7/099* (2006.01)

(52) U.S. Cl.
CPC ............. *H03B 5/24* (2013.01); *H03L 7/0991* (2013.01)

(58) Field of Classification Search
CPC ................................ H03B 5/24; H03L 7/0991
See application file for complete search history.

(56) References Cited

U.S. PATENT DOCUMENTS 7,692,500 B1 * 4/2010 Koukab .................. H04L 27/12 332/127
8,253,506 B2 * 8/2012 Liu .......................... H03L 7/104 331/177 V

* cited by examiner

*Primary Examiner* — Jeffrey M Shin
(74) *Attorney, Agent, or Firm* — Winston Hsu

(57) ABSTRACT

A digitally controlled oscillator (DCO) with segmented varactor bank and multiple-voltage linearization and associated apparatus are provided. The DCO may include a varactor array, with the varactor array including a plurality of varactors positioned in the segmented varactor bank, and include a plurality of bridge biasing resistors positioned in the segmented varactor bank, a plurality of capacitors coupled between multiple varactor sets within the segmented varactor bank and a set of differential oscillation nodes of the DCO, and a negative transconductance ($g_m$) network ($-g_m$ network) coupled to the set of differential oscillation nodes. Additionally, one set of varactor units and multiple remaining sets of varactor units respectively belonging to at least one varactor set and remaining varactor sets may be configured as active units and frozen units to receive a set of tune voltages and a set of predetermined voltages, respectively, for providing the multiple-voltage linearization at the active units.

15 Claims, 20 Drawing Sheets

DIGITALLY CONTROLLED OSCILLATOR WITH SEGMENTED VARACTOR BANK AND MULTIPLE-VOLTAGE LINEARIZATION, AND ASSOCIATED APPARATUS

CROSS REFERENCE TO RELATED APPLICATIONS

This application claims the benefit of U.S. Provisional Application No. 63/747,951, filed on Jan. 22, 2025. The content of the application is incorporated herein by reference.

BACKGROUND

The present invention is related to circuit design, and more particularly, to a digitally controlled oscillator (DCO) with a segmented varactor bank and multiple-voltage linearization, and associated apparatus such as a phase-locked loop (PLL) comprising the DCO as well as associated methods such as operation methods of the DCO, the PLL, etc.

According to the related art, DCO frequency tuning may be achieved by many switchable capacitor (cap) units modulated by a sigma-delta modulation (SDM) modulator. For a cellular frequency range 1 (FR1) frequency division duplex (FDD) operation system, the stringent transmission (TX) to reception (RX) noise typically requires either a higher SDM operation speed or a smaller cap step. High speed SDM may cause high current consumption. For example, in order to reduce the SDM speed, a smaller cap step may be needed, so the unit number may increase correspondingly, and therefore the layout complexity may increase correspondingly and the capacitance loading may also increase, leading to an unwanted design. It seems that there is no proper solution in the related art. Thus, a novel method and associated architecture are needed for solving the problem without introducing any side effect or in a way that is less likely to introduce a side effect.

SUMMARY

It is an objective of the present invention to provide a DCO with a segmented varactor bank and multiple-voltage linearization, and associated apparatus such as a PLL comprising the DCO as well as associated methods such as operation methods of the DCO, the PLL, etc., in order to solve the above-mentioned problem.

At least one embodiment of the present invention provides a DCO with a segmented varactor bank and multiple-voltage linearization, where the DCO may comprise a varactor array, with the varactor array comprising a plurality of varactors positioned in the segmented varactor bank, and comprise a plurality of bridge biasing resistors positioned in the segmented varactor bank, a plurality of capacitors that are coupled between multiple varactor sets within the segmented varactor bank and a set of differential oscillation nodes of the DCO, and a negative transconductance ($g_m$) network (or "the $-g_m$ network") that is coupled to the set of differential oscillation nodes. For example, the varactor array may be composed of the multiple varactor sets, any varactor set among the multiple varactor sets is composed of at least one varactor unit among multiple varactor units belonging to the multiple varactor sets, and any varactor unit among the multiple varactor units is composed of a pair of varactors among the plurality of varactors; the plurality of bridge biasing resistors may be configured to bridge the multiple varactor sets of the varactor array, for biasing the multiple varactor sets with a series of intermediate voltages within a predetermined biasing voltage range controlled by a predetermined biasing voltage; the plurality of capacitors may be configured as alternating current (AC) coupled capacitors between the multiple varactor sets and the set of differential oscillation nodes, wherein the aforementioned any varactor set among the multiple varactor sets is coupled to the set of differential oscillation nodes via a set of AC coupled capacitors, respectively; and the negative transconductance network may be configured to sustain oscillation of a set of differential oscillation signals at the set of differential oscillation nodes. In addition, one set of varactor units and multiple remaining sets of varactor units among the multiple varactor units, such as the one set of varactor units and the multiple remaining sets of varactor units respectively belonging to at least one varactor set and remaining varactor sets among the multiple varactor sets, may be configured as active units and frozen units to receive a set of tune voltages and a set of predetermined voltages, respectively, for providing the multiple-voltage linearization at the active units.

At least one embodiment of the present invention provides a PLL comprising the DCO mentioned above.

It is an advantage of the present invention that the DCO of the present invention, as well as the associated apparatus such as the PLL comprising the DCO, can utilize the proposed segmented varactor bank with the multiple-voltage linearization to achieve optimal overall performance. For example, the proposed items in the present invention as well as the associated advantages of the proposed method and/or architecture may be listed as follows:

(Item #1) Tracking varactor array with single-type varactor and complementary digital-to-analog converter (DAC): compared with complementary varactors, the single-type varactor is less sensitive to process variation;

(Item #2) Multi-tune-voltage (or "Multi-Vtune" while "tune voltage" may be referred to as "Vtune" for brevity) method for varactor linearization: better area efficiency, more effective linearization, less gain variation over process corners, and lower bias voltage (which may be referred to as "Vbias" for brevity) noise modulation gain;

(Item #3) Bridge Biasing Resistor (or "Bridge Biasing R" which may be referred to as "RBridge" for brevity): relaxed biasing resistor requirement; and (Item #4) Area-efficient DAC Multiplexer (MUX) array: low area overhead with 6 DAC outputs.

Additionally, the method of the present invention and the associated apparatus can solve the related art problem without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
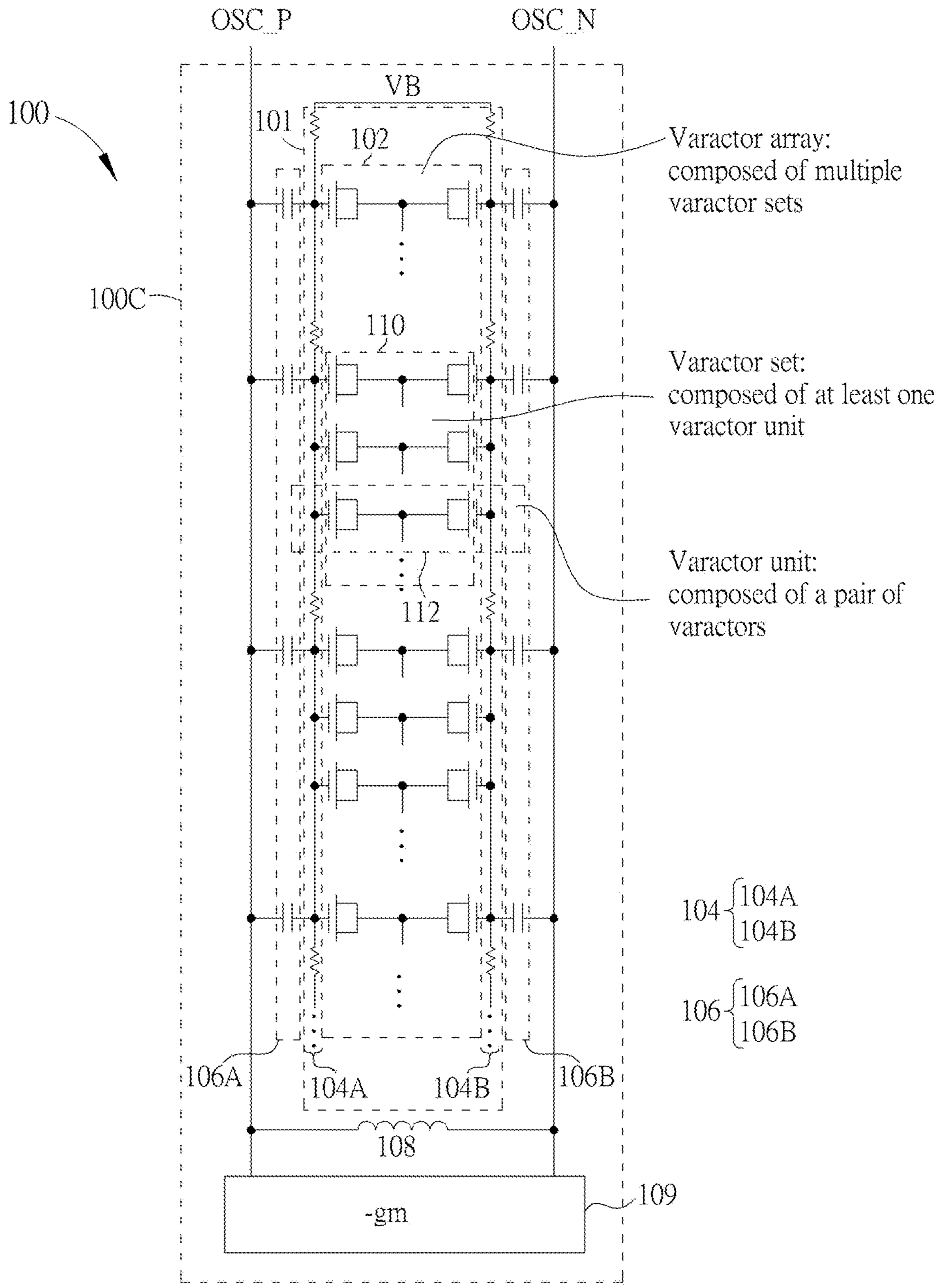
FIG. 1 is a diagram illustrating the main circuit architecture of a DCO with a segmented varactor bank and multiple-voltage linearization according to an embodiment of the present invention.

FIG. 1 is a diagram illustrating the main circuit architecture of a DCO 100 equipped with a segmented varactor bank 101 and multiple-voltage linearization according to an embodiment of the present invention. For better comprehension, the DCO 100 can be implemented in a digital synthesizer, and more particularly, can be used for receiving a digital code sent from a digital filter and generating a DCO clock (clk) corresponding to the digital code, to make the frequency of the DCO clock output from the DCO 100 be related to the digital code input into the DCO 100, but the present invention is not limited thereto. According to some embodiments, the DCO 100 can be implemented in any device among various kinds of devices.

The main circuit of the DCO 100 may comprise a core circuit 100C, and the core circuit 100C may be illustrated as shown in FIG. 1, but the present invention is not limited thereto. The DCO 100 may comprise a varactor array 102, with the varactor array 102 comprising a plurality of varactors positioned in the segmented varactor bank 101, and may further comprise a plurality of bridge biasing resistors 104 (e.g., the plurality of bridge biasing resistors 104 comprising a first set of bridge biasing resistors 104A and a second set of bridge biasing resistors 104B) positioned in the segmented varactor bank 101, a plurality of capacitors 106 (e.g., the plurality of capacitors 106 comprising multiple first capacitors 106A and multiple second capacitors 106B, configured as multiple first AC coupled capacitors 106A and multiple second AC coupled capacitors 106B, respectively) that are coupled between multiple varactor sets {110} (e.g., (X+1) varactor sets {110_*x*|x=0, 1, . . . , X}, where "X" may represent a positive integer, and "x" may be an integer in the interval [0, X]) within the segmented varactor bank 101 and a set of differential oscillation nodes OSC_P and OSC_N of the DCO 100, at least one inductor 108 that is coupled between the set of differential oscillation nodes OSC_P and OSC_N, and a negative transconductance ($g_m$) network 109 (labeled "$-g_m$" for brevity) that is coupled to the set of differential oscillation nodes OSC_P and OSC_N.

For example, the varactor array 102 may be composed of the multiple varactor sets {110}, any varactor set 110 (e.g., the varactor set 110_*x*) among the multiple varactor sets {110} is composed of at least one varactor unit (e.g., one or more varactor units) among multiple varactor units {112} (e.g., (Y+1) varactor units {112_*y*|y=0, 1, . . . , Y}, where "Y" may represent a positive integer, and "y" may be an integer in the interval [0, Y]) belonging to the multiple varactor sets {110}, and any varactor unit 112 (e.g., the varactor unit 112_*y*) among the multiple varactor units {112} is composed of a pair of varactors among the plurality of varactors. In addition, the plurality of bridge biasing resistors 104 may be configured to bridge the multiple varactor sets {110} of the varactor array 102, for biasing the multiple varactor sets {110} with a series of intermediate voltages within a predetermined biasing voltage range controlled by a predetermined biasing voltage VB. The plurality of capacitors 106 may be configured as AC coupled capacitors between the multiple varactor sets {110} and the set of differential oscillation nodes OSC_P and OSC_N, where the aforementioned any varactor set 110 among the multiple varactor sets {110} is coupled to the set of differential oscillation nodes OSC_P and OSC_N via a set of AC coupled capacitors, respectively. For example, the set of AC coupled capacitors may comprise a first AC coupled capacitor among the multiple first AC coupled capacitors 106A and a second AC coupled capacitor among the multiple second AC coupled capacitors 106B, where the aforementioned any varactor set 110 among the multiple varactor sets {110} is coupled to the first and the second oscillation nodes OSC_P and OSC_N via the first AC coupled capacitor and the second AC coupled capacitor, respectively. Additionally, the negative transconductance network 109 may be configured to sustain oscillation of a set of differential oscillation signals at the set of differential oscillation nodes OSC_P and OSC_N. This is for illustrative purposes only, and is not meant to be a limitation of the present invention. According to some embodiments, the main circuit architecture such as the architecture of the main circuit (or the core circuit 100C) within the DCO 100 and/or the associated operations thereof may vary.

In the architecture shown in FIG. 1, one set of varactor units and multiple remaining sets of varactor units among the multiple varactor units {112}, such as the one set of varactor units and the multiple remaining sets of varactor units respectively belonging to at least one varactor set (e.g., one or more varactor sets) and remaining varactor sets among the multiple varactor sets {110}, may be configured as active units and frozen units to receive a set of tune voltages {Vtune} (e.g., Z tune voltages {Vtune(z)|z=1, . . . , Z}, where "Z" may represent a positive integer that is greater than one, and "z" may be an integer in the interval [1, Z]) and a set of predetermined voltages {Vpred} (e.g., two or more predetermined voltages {Vpred(1), Vpred(2), . . . }), respectively, for providing the multiple-voltage linearization at the active units. For example, the set of tune voltages {Vtune} may comprise at least two tune voltages {Vtune(z)} such as the tune voltages Vtune(1) and Vtune(2) (or "the tune voltages Vtune1 and Vtune2" for brevity), but the present invention is not limited thereto. In some examples, the set of tune voltages {Vtune} may comprise may comprise more than two tune voltages {Vtune(z)} such as the tune voltages Vtune(1), Vtune(2) and Vtune(3) (or "the tune voltages Vtune1, Vtune2 and Vtune3" for brevity). In addition, the set of predetermined voltages {Vpred} may comprise a first predetermined voltage Vpred(1) such as a higher voltage VpredH among the set of predetermined voltages {Vpred} and a second predetermined voltage Vpred(2) such as a lower voltage VpredL among the set of predetermined voltages {Vpred}. According to some embodiments, the first predetermined voltage Vpred(1) and the second predetermined voltage Vpred(2) represent a power voltage VDD and a ground voltage VSS, respectively.

More particularly, any active unit among the active units may be configured to receive one of the set of tune voltages {Vtune} (e.g., the tune voltages Vtune(1), Vtune(2) and Vtune(3) such as the tune voltages Vtune1, Vtune2 and Vtune3) via the central tuning node of the aforementioned any active unit, and any frozen unit among the frozen units may be configured to receive one of the set of predetermined voltages {Vpred} (e.g., the predetermined voltages Vpred(1) and Vpred(2) such as the power voltage VDD and the ground voltage VSS) via the central tuning node of the aforementioned any frozen unit. For example, no matter whether the varactor unit 112 (or the varactor unit 112_*y*) is configured as the aforementioned any active unit or the aforementioned any frozen unit, the central tuning node thereof may represent the node at the center of this varactor unit 112 (or this varactor unit 112_*y*), where the node may be illustrated with a dot having a vertical line or wire extended therefrom for better comprehension.

Figure 2:
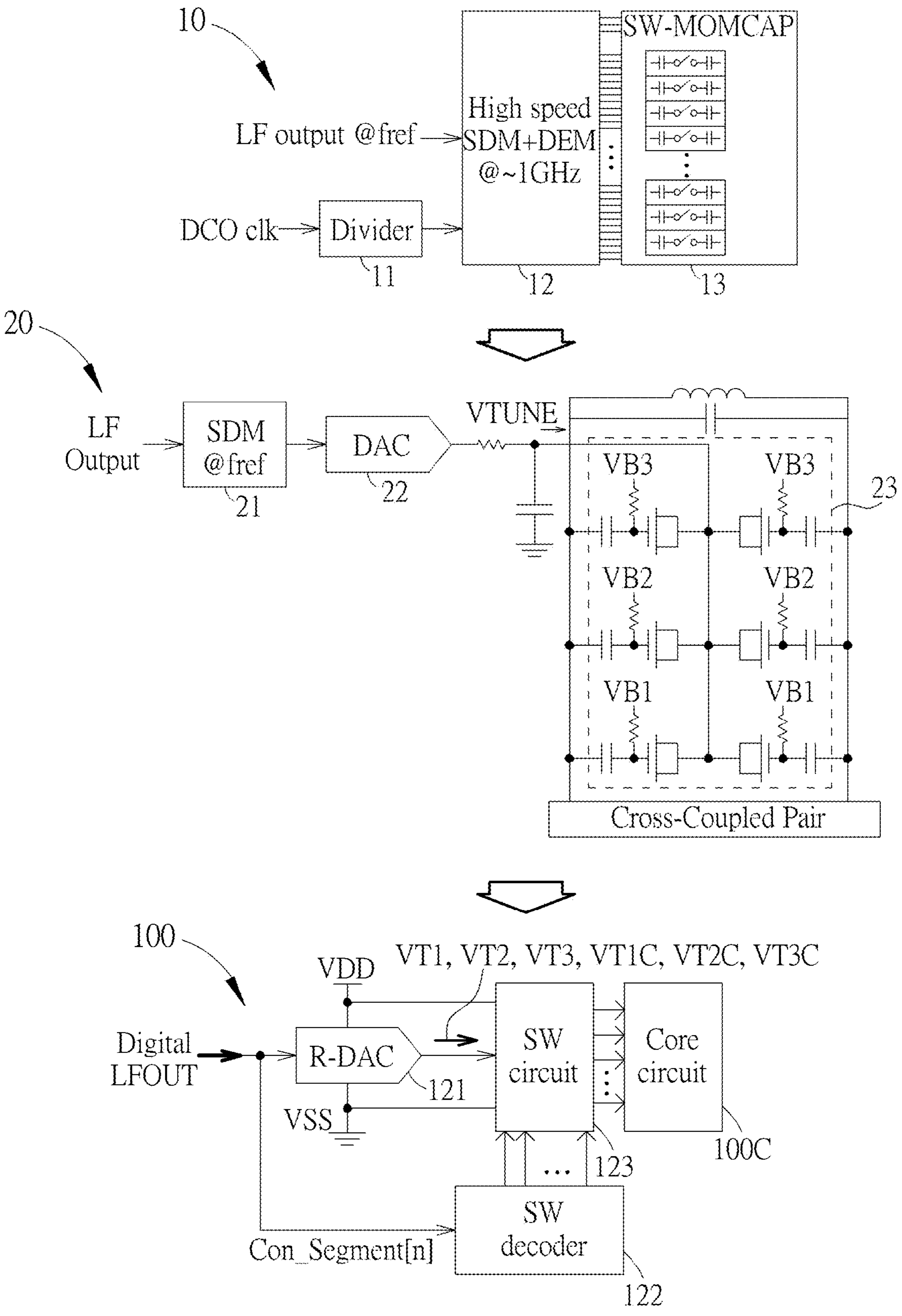
FIG. 2 illustrates, in the lower part thereof, some implementation details of the DCO shown in FIG. 1 according to an embodiment of the present invention, where some other DCOs with different circuit architectures may be illustrated in the upper part and the central part of FIG. 2 for better comprehension.

FIG. 2 illustrates, in the lower part thereof, some implementation details of the DCO 100 shown in FIG. 1 according to an embodiment of the present invention, where some other DCOs 10 and 20 with different circuit architectures may be illustrated in the upper part and the central part of FIG. 2 for better comprehension. The DCO 10 may comprise a divider 11, a high speed SDM plus dynamic element matching (DEM) circuit 12, and a switchable metal oxide metal cap (MOM) capacitor module 13 (labeled "SW-MOMCAP" for brevity) equipped with a plurality of switchable MOM capacitor units, which may be implemented by way of switches and MOM capacitors. The divider 11 may perform frequency dividing on a DCO clock (clk) of the DCO 10 to generate a divided clock, the high speed SDM plus DEM circuit 12 may operate according to a loop filter (LF) output having a reference frequency fref (labeled "LF output @fref" for brevity) and the divided clock to control the switchable MOM capacitor module 13 (in particular, the switches of the switchable MOM capacitor units therein). For example, an inductor-capacitor (LC) tank in the architecture of the DCO 10 may comprise the plurality of switchable MOM capacitor units for generating the DCO clock, and the DCO clock may be used as a feedback signal. The frequency of the DCO clock may decrease when the number of enabled MOM capacitors increases, and may increase when the number of enabled MOM capacitors decreases. In order to reasonably limit or reduce the number of MOM capacitors, a SDM modulator may be implemented on the control path in the architecture of the DCO 10, and more particularly, may be implemented in the high speed SDM plus DEM circuit 12, allowing a higher resolution to be achieved without increasing the number of the MOM capacitors. The high speed SDM plus DEM circuit 12 can operate at about 1 gigahertz (GHz) (labeled "High speed SDM+DEM@~1 GHz" for brevity) for controlling the switchable MOM capacitor module 13. The DCO frequency tuning is achieved by many switchable capacitor (cap) units (e.g., the switchable MOM capacitor units) modulated by the SDM modulator. For a FR1 FDD operation system, the stringent TX to RX noise typically requires either a higher SDM operation speed or a smaller cap step. High speed SDM may cause high current consumption. For example, in order to reduce the SDM speed, a smaller cap step may be needed, so the unit number may increase correspondingly, and therefore the layout complexity may increase correspondingly and the capacitance loading may also increase. As a result of a tradeoff, more than five hundreds switchable MOM capacitor units may be implemented in the DCO 10 and the operation speed of the high speed SDM plus DEM circuit 12 may reach 1 GHz approximately. The high current consumption can be regarded as the main issue of the DCO 10.

As shown in the central part of FIG. 2, the DCO 20 may comprise an SDM 21 for receiving the LF output to operate at the reference frequency fref (labeled "SDM @fref" for brevity), and comprise a DAC 22, a resistor-capacitor (RC) filter formed with a resistor and a capacitor, as well as other components in a last stage, such as a varactor array 23, an inductor, a capacitor and a cross-coupled pair. For example, the reference frequency fref may be a much lower frequency that is much lower than 1 GHZ, such as 26 megahertz (MHz) or 52 MHz. The DCO 20 may use the SDM 21 operated at the low-speed reference clock and use the RC filter to remove SDM quantization noise (Qn). In the varactor array 23, there are three varactor units that are respectively biased by the bias voltages VB1, VB2 and VB3, and the varactor gain provided by any varactor unit among the three varactor units can be measured with the capacitance variation, such as "dC" with "C" denoting the capacitance, divided by the voltage variation, such as "dV" with "V" denoting the voltage. For the aforementioned any varactor unit among the three varactor units, the varactor gain can be expressed with a curve of |dC/dV| with respect to the tune voltage VTUNE. As a result, three curves respectively corresponding to the bias voltages VB1, VB2 and VB3 can be obtained. The overall gain provided by the varactor array 23 can be equal to the summation of the respective varactor gains of the three varactor units, and therefore can be expressed with a corresponding curve indicating the summation of the respective varactor gains of the three varactor units, with the horizontal axis and the vertical axis representing the tune voltage VTUNE and the gain (or |dC/dV|), respectively, on the |dC/dV| to VTUNE plot. In order to achieve a better overall performance, the DCO 20 typically needs a high varactor gain for providing a large tuning range, and the high varactor gain leads to a tough DAC design in noise and resolution for low out-band noise case. For example, the DAC current of the DAC 22 should be very large or the resolution of the DAC 22 should be very high. In addition, the RC filter introduces at least one additional pole which limits the loop bandwidth. The high varactor gain and the limited loop bandwidth can be regarded as the main issues of the DCO 20.

As shown in the lower part of FIG. 2, in addition to the main circuit such as the core circuit 100C, the DCO 100 may further comprise a multi-output DAC circuit such as a resistor ladder DAC (R-DAC) 121, a decoder such as a switching decoder 122 (labeled "SW decoder" for brevity), and a switching circuit 123 (labeled "SW circuit" for brevity) that is coupled between the multi-output DAC circuit (e.g., the R-DAC 121) and the multiple varactor units {112} (e.g., the (Y+1) varactor units {112_*y*|y=0, 1, . . . , Y}) within the core circuit 100C. The multi-output DAC circuit such as the R-DAC 121 can be configured to generate multiple output voltages {VT(1), VT(2), . . . } such as the DAC output voltages VT1, VT2, VT3, VT1C, VT2C and VT3C according to a digital code Con_Segment[n], with the digital code Con_Segment[n] being carried by a digital LF output (labeled "Digital LFOUT" for brevity) such as the output of a digital LF acting as the previous stage of the DCO 100, and the switching circuit 123 can be configured to perform switching operations on the multiple output voltages {VT(1), VT(2), . . . } such as the DAC output voltages VT1, VT2, VT3, VT1C, VT2C and VT3C and the set of predetermined voltages {Vpred} (e.g., the predetermined voltages Vpred(1) and Vpred(2) such as the power voltage VDD and the ground voltage VSS), for providing the set of tune voltages {Vtune} (e.g., the tune voltages Vtune(1), Vtune(2) and Vtune(3) such as the tune voltages Vtune1, Vtune2 and Vtune3) and the set of predetermined voltages {Vpred} (e.g., the power voltage VDD and the ground voltage VSS) to the active units and the frozen units, respectively, where a set of output voltages {VT} among the multiple output voltages {VT(1), VT(2), . . . } such as the DAC output voltages VT1, VT2, VT3, VT1C, VT2C and VT3C are used as the set of tune voltages {Vtune}.

The voltage count of the multiple output voltages {VT(1), VT(2), . . . } such as the DAC output voltages VT1, VT2, VT3, VT1C, VT2C and VT3C can be a multiple of the voltage count of the set of output voltages {VT} (e.g., the DAC output voltages {VT(1), VT(2), VT(3)}). For example, the multiple output voltages may comprise the set of output voltages {VT}, such as the set of DAC output voltages {VT1, VT2, VT3}, and comprise a set of complementary output voltages that are complementary to the set of output voltages {VT}, such as the set of DAC output voltages {VT1C, VT2C, VT3C} that are complementary to the set of DAC output voltages {VT1, VT2, VT3}, but the present invention is not limited thereto. As the set of DAC output voltages {VT1, VT2, VT3} and the set of DAC output voltages {VT1C, VT2C, VT3C} are complementary to each other, the set of output voltages {VT} may represent any set among the two sets of DAC output voltages {{VT1, VT2, VT3}, {VT1C, VT2C, VT3C}}, and the set of complementary output voltages may represent the other set among the two sets of DAC output voltages {{VT1, VT2, VT3}, {VT1C, VT2C, VT3C}}. More particularly, the difference between any two adjacent output voltages (e.g., the two DAC output voltages VT1 and VT2, or the two DAC output voltages VT2 and VT3) among the set of output voltages {VT} (e.g., the set of DAC output voltages {VT1, VT2, VT3}) can be equal to a predetermined voltage difference, for achieving the multiple-voltage linearization at the active units, and the difference between any two adjacent complementary output voltages (e.g., the two DAC output voltages VT1C and VT2C, or the two DAC output voltages VT2C and VT3C) among the set of complementary output voltages (e.g., the set of DAC output voltages {VT1C, VT2C, VT3C}) is equal to the predetermined voltage difference, for achieving the multiple-voltage linearization at the active units.

In addition, the decoder such as the switching decoder 122 can be configured to decode the digital code Con_Segment[n] to generate a decoded result, for controlling the switching operations of the switching circuit 123. For example, the switching circuit 123 comprises multiple sets of switches (not shown in FIG. 2) that are coupled to the multiple varactor units {112} (e.g., the (Y+1) varactor units {112_*y*|y=0, 1, . . . , Y}) within the core circuit 100C, respectively, for performing the switching operations according to the decoded result. Based on the architecture of the DCO 100 as shown in FIG. 2, the multiple varactor units {112} (e.g., the (Y+1) varactor units {112_y|y=0, 1, . . . , Y}) within the core circuit 100C can be configured to dynamically change among the roles of the active units and the frozen units with respect to the decoded result. Under control of at least one previous stage among multiple previous stages of the core circuit 100C, such as the switching decoder 122 and the switching circuit 123, the difference between any two adjacent tune voltages (e.g., the tune voltages Vtune(1) and Vtune(2) such as the tune voltages Vtune1 and Vtune2, or the tune voltages Vtune(2) and Vtune(3) such as the tune voltages Vtune2 and Vtune3) among the set of tune voltages {Vtune} (e.g., the tune voltages Vtune(1), Vtune(2) and Vtune(3) such as the tune voltages Vtune1, Vtune2 and Vtune3) is equal to the predetermined voltage difference, for achieving the multiple-voltage linearization at the active units.

Figure 3:
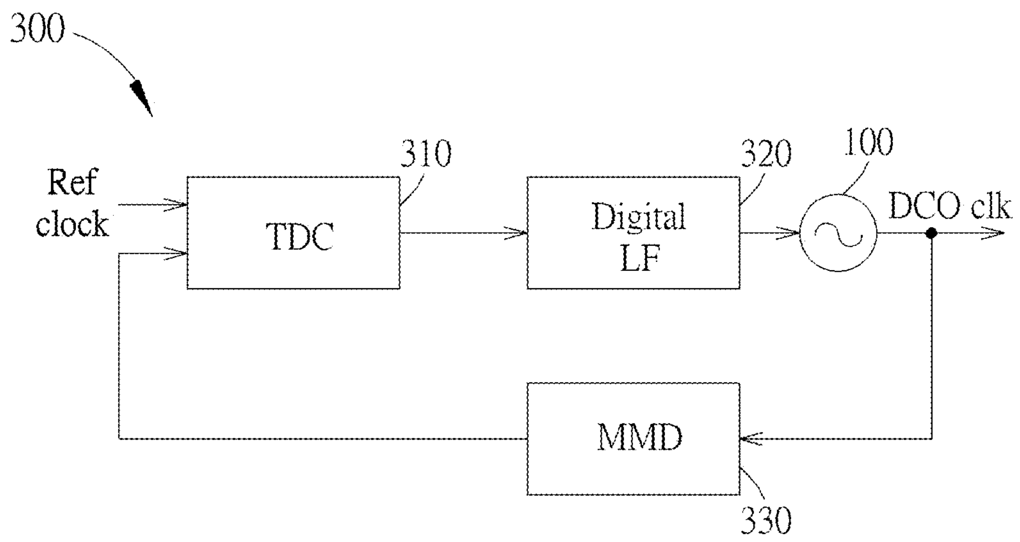
FIG. 3 is a diagram illustrating a PLL comprising the DCO shown in the lower part of FIG. 2 according to an embodiment of the present invention.

FIG. 3 is a diagram illustrating a PLL 300 comprising the DCO 100 shown in the lower part of FIG. 2 according to an embodiment of the present invention. In addition to the DCO 100, the PLL 300 may further comprise a time-to-digital converter (TDC) 310, a digital loop filter (LF) 320 and a multi-modulus divider (MMD) 330, where the digital LF 320 can be taken as an example of the aforementioned digital LF acting as the previous stage of the DCO 100, and the PLL 300 can be implemented as an all-digital PLL (ADPLL), but the present invention is not limited thereto. According to some embodiments, the architecture of the PLL 300 may vary. For example, the PLL 300 can be implemented by way of any type of PLL among various types of PLLs such as MMD-less ADPLL and MMD ADPLL, for being integrated into a frequency synthesizer within a communication apparatus. Examples of the communication apparatus may include but not limited to: a multifunctional mobile phone, a tablet computer, etc. In addition, the proposed DCO such as the DCO 100 and the associated apparatus such as the PLL 300 can utilize the proposed segmented varactor bank such as the segmented varactor bank 101 with the multiple-voltage linearization such as multi-Vtune linearization to achieve the optimal overall performance.

TABLE 1

| Proposed item | Advantages of the proposed method & architecture |
|---|---|
| Tracking varactor array with single-type varactor and complementary DAC | Compared with complementary varactors, the single-type varactor is less sensitive to process variation. |
| Multi-Vtune method for varactor linearization | Better area efficiency;<br>More effective linearization;<br>Less gain variation over process corners; and<br>Lower Vbias noise modulation gain. |
| Bridge Biasing R | Relaxed biasing resistor requirement. |
| Area-efficient DAC MUX array | Low area overhead with multiple DAC outputs. |

Table 1 illustrates the proposed items based on some embodiments as well as the associated advantages of the proposed method and architecture. Further details will be described in the subsequent embodiments.

Figure 4:
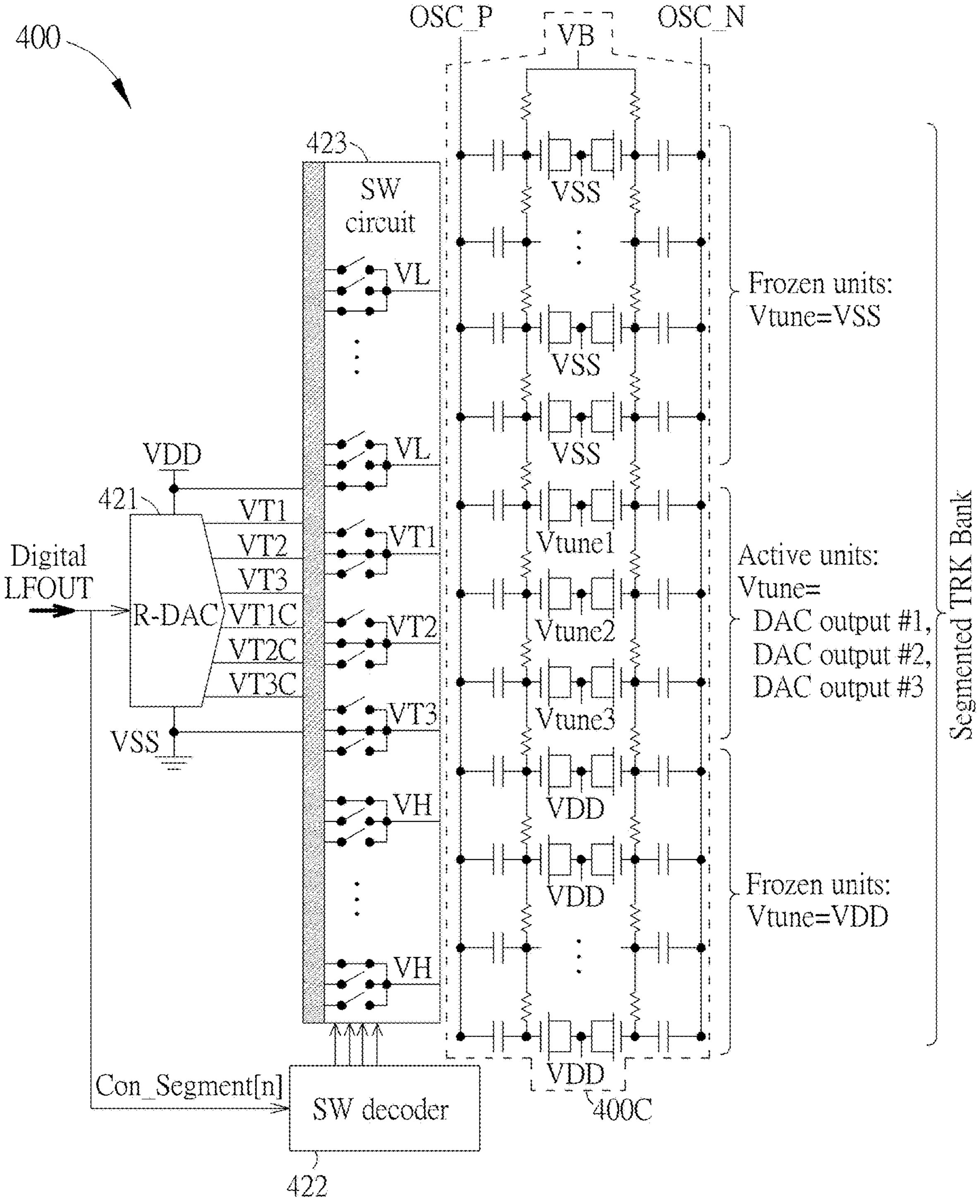
FIG. 4 is a diagram illustrating a DCO according to another embodiment of the present invention.

FIG. 4 is a diagram illustrating a DCO 400 according to another embodiment of the present invention, where the DCO 400 can be taken as an example of the DCO 100 shown in FIG. 2, and the core circuit 400C, the R-DAC 421, the switching decoder 422 (labeled "SW decoder" for brevity), and the switching circuit 423 (labeled "SW circuit" for brevity) within the DCO 400 can be taken as examples of the core circuit 100C, the R-DAC 121, the switching decoder 122, and the switching circuit 123 within the DCO 100, respectively. In addition, the higher voltage VpredH and the lower voltage VpredL mentioned above can be implemented as the predetermined voltages VH and VL, respectively. For example, the predetermined voltage VH can be equal to the power voltage VDD at the power terminal (e.g., the upper terminal) of the R-DAC 421, and the predetermined voltage VL can be equal to the ground voltage VSS at the ground terminal (e.g., the lower terminal) of the R-DAC 421, but the present invention is not limited thereto. According to some embodiments, the tune voltages {Vtune} applied to the central nodes of the lower set of frozen units (e.g., the frozen units below the active units within the core circuit 400C) and the central nodes of the upper set of frozen units (e.g., the frozen units above the active units within the core circuit 400C) can be illustrated as the predetermined voltages VH and VL, respectively, rather than the power voltage VDD and the ground voltage VSS, respectively, for indicating that the predetermined voltages VH and VL can be equal to any set of higher/lower voltages among various sets of higher/lower voltages. Additionally, the tune voltages {Vtune} applied to the central nodes of the active units, such as the tune voltages Vtune1, Vtune2 and Vtune3, can be equal to the DAC outputs #1, #2 and #3 (e.g., the set of DAC output voltages {VT1, VT2, VT3}, or the set of DAC output voltages {VT1C, VT2C, VT3C}), respectively. For brevity, similar descriptions for this embodiment are not repeated in detail here.

Figure 5:
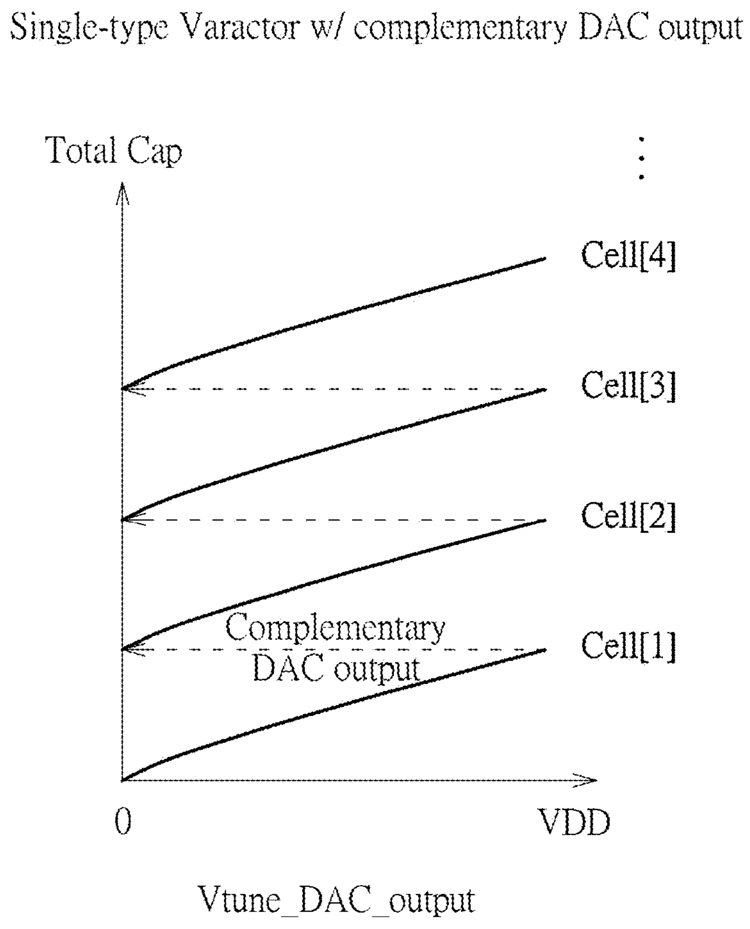
FIG. 5 illustrates some curves involved with the DCO shown in FIG. 4 according to an embodiment of the present invention, where the curves may indicate the relationships between the total capacitance and the Vtune DAC output.

FIG. 5 illustrates some curves involved with the DCO 400 shown in FIG. 4 according to an embodiment of the present invention, where the curves may indicate the relationships between the total capacitance (or "the Total Cap") and the tune voltages {Vtune} such as the DAC outputs of the R-DAC 421 (labeled "Vtune_DAC_output" for brevity). For example, the tune voltages {Vtune} such as the DAC outputs may vary from the predetermined voltage VL such as the ground voltage VSS (e.g., 0) to the predetermined voltage VH such as the power voltage VDD. In addition, as the varactor units can also be referred as varactor cells according to some viewpoints, the series of varactor units within the core circuit 400C can be named as (or labeled as) the varactor units {Cell[1], Cell[2], Cell[3], Cell[4], . . . }. The series of varactor units such as the varactor units {Cell[1], Cell[2], Cell[3], Cell[4], . . . } can contribute the Total Cap as illustrated with the curves corresponding to these varactor units, respectively, while the arrows depicted with dashed lines may indicate the effects of using the complementary DAC outputs, for establishing and/or supporting the multiple-voltage linearization such as the multi-Vtune linearization. Based on the architecture shown in FIG. 4, the proposed segmented varactor bank such as that of the core circuit 400C can utilize the aforementioned single-type varactor such as a single type of varactors with (w/) the complementary DAC outputs to obtain an equivalent gain from at least the active units according to the Total Cap shown in FIG. 5, in order to achieve the multi-Vtune linearization. In comparison with complementary varactors, the single-type varactor is less sensitive to the process variation.

The most challenging design issue of a tracking bank (or "the TRK bank") is the linearization of varactor. Typically, the varactor gain variation is greater than 200% and causes severe PLL bandwidth (BW) variation. The proposed multi-Vtune linearization can mitigate this issue efficiently.

Figure 6:
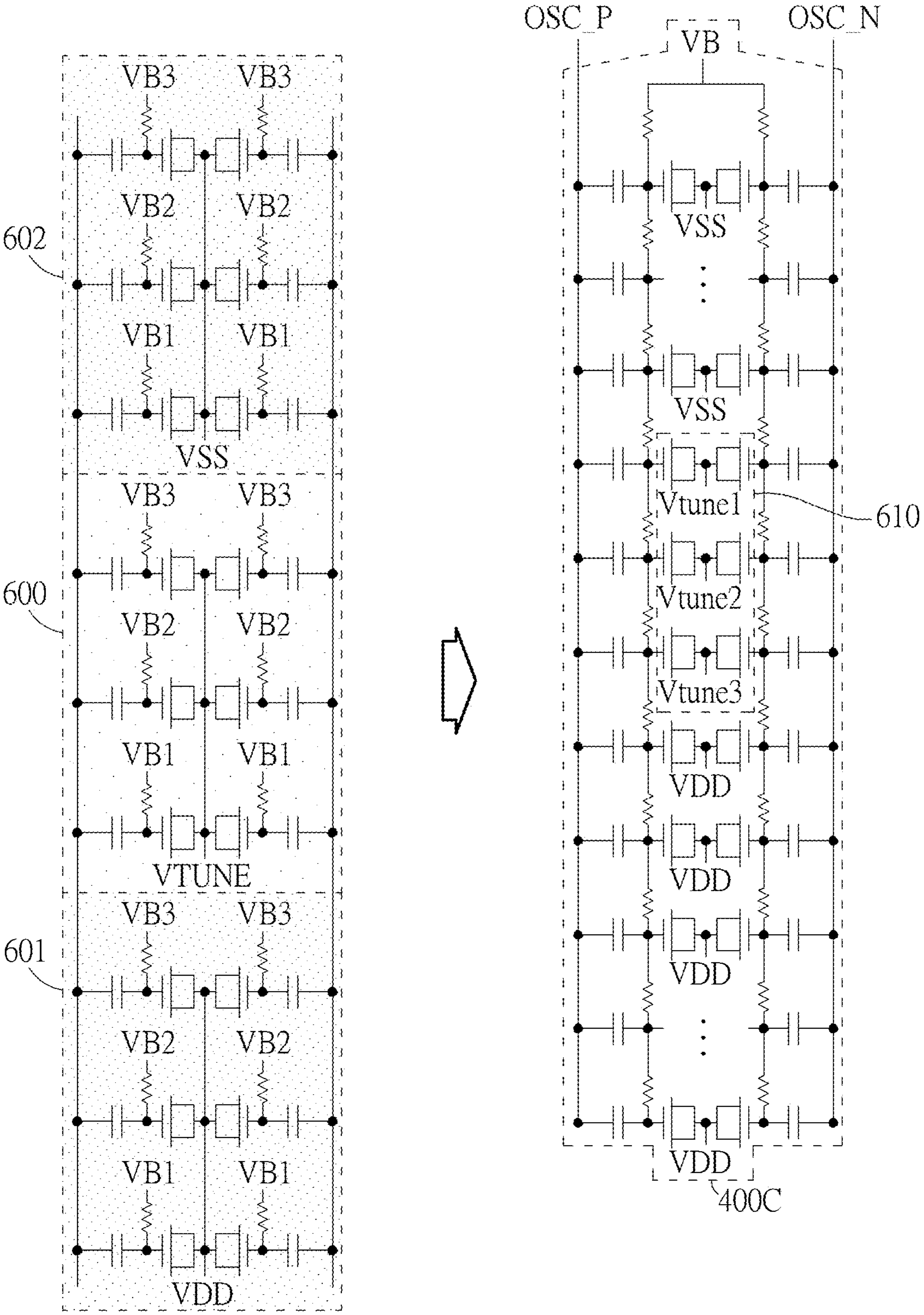
FIG. 6 illustrates, in the right half part thereof, a multi-tune-voltage control scheme of an operation method of the proposed DCO according to an embodiment of the present invention, where a multi-bias-voltage control scheme may be illustrated in the left half part of FIG. 6 for better comprehension.

FIG. 6 illustrates, in the right half part thereof, a multi-tune-voltage control scheme (referred to as the multi-Vtune control scheme hereinafter) of an operation method of the proposed DCO (e.g., the DCO 100 shown in FIG. 2, such as the DCO 400) according to an embodiment of the present invention, where a multi-bias-voltage control scheme (referred to as the multi-Vbias control scheme hereinafter) may be illustrated in the left half part of FIG. 6 for better comprehension. The series of varactor units within the core circuit 400C as shown in FIG. 6, such as the varactor units with the central nodes thereof being biased by the tune voltages {Vtune} such as the series of voltages {VSS, . . . , Vtune1, Vtune2, Vtune3, VDD, VDD, VDD, . . . , VDD}, respectively, can be taken as an example of the multiple varactor units {112} mentioned above. In addition, the active units 610 can be dynamically selected from the series of varactor units within the core circuit 400C in accordance with the digital code Con_Segment [n] (e.g., the digital code Con_Segment [n] obtained from the digital LF output such as the Digital LFOUT as shown in FIG. 4), as if the active units 610 are dynamically sliding through the series of varactor units within the core circuit 400C along the vertical direction in FIG. 6.

Based on the multi-Vtune control scheme, all cells are identical but with different Vtune offsets, while the multi-Vbias cells in the multi-Vbias linearization module array (e.g., the multi-Vbias linearization module array comprising the multi-Vbias linearization modules 600, 601 and 602, each of which looks like the multi-Vbias linearization module comprising the varactor array 23 within the DCO 20 shown in the central part of FIG. 2, and comprise multiple multi-Vbias cells that are biased by different bias voltages {VB} such as the three bias voltages VB1, VB2 and VB3, respectively) of the multi-Vbias control scheme are NOT identical due to the different capacitance-voltage (CV) curves.

Figure 7:
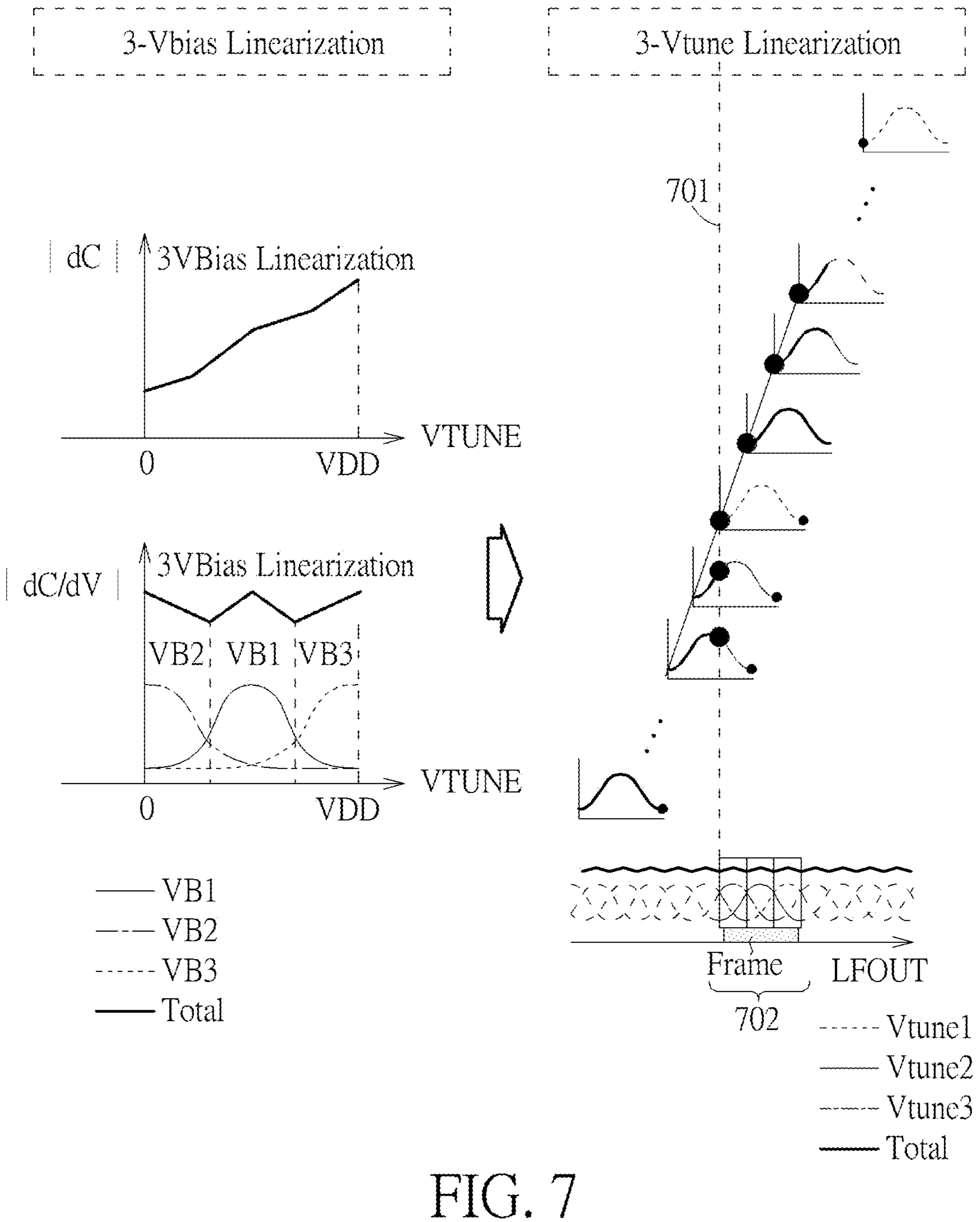
FIG. 7 illustrates, in the right half part thereof, the multi-tune-voltage linearization of the multi-tune-voltage control scheme shown in FIG. 6 according to an embodiment of the present invention, where the multi-bias-voltage linearization of the multi-bias-voltage control scheme shown in FIG. 6 may be illustrated in the left half part of FIG. 7 for better comprehension.

FIG. 7 illustrates, in the right half part thereof, the multi-tune-voltage linearization (referred to as the multi-Vtune linearization hereinafter) of the multi-Vtune control scheme shown in FIG. 6 according to an embodiment of the present invention, where the multi-bias-voltage linearization (referred to as the multi-Vbias linearization hereinafter) of the multi-Vbias control scheme shown in FIG. 6 may be illustrated in the left half part of FIG. 7 for better comprehension. Regarding the multi-Vbias linearization such as 3-Vbias linearization (or "the 3VBias Linearization"), for any multi-Vbias cell among the three multi-Vbias cells respectively biased by the three bias voltages VB1, VB2 and VB3 within the multi-Vbias linearization module 600 shown in FIG. 6, the varactor gain can be expressed with a curve of |dC/dV| with respect to the tune voltage VTUNE, and three curves respectively corresponding to the three bias voltages VB1, VB2 and VB3 can be obtained as illustrated with the |dC/dV| to VTUNE plot shown in the lower left part of FIG. 7, with the horizontal axis and the vertical axis representing the tune voltage VTUNE and the gain (or |dC/dV|), respectively. The total gain such as the overall gain provided by the multi-Vbias linearization module 600 can be equal to the summation of the respective varactor gains of the three multi-Vbias cells, and therefore can be expressed with a corresponding curve (labeled "Total") for indicating the summation of the respective varactor gains of the three multi-Vbias cells. For better comprehension, the corresponding dC to VTUNE relationships can be expressed with another curve on the dC to VTUNE plot, with the horizontal axis and the vertical axis representing the tune voltage VTUNE and the capacitance variation dC, respectively.

Regarding the multi-Vtune linearization such as 3-Vtune linearization, under control of at least one previous stage among multiple previous stages of the core circuit 400C as shown in FIG. 4, such as the switching decoder 422 and the switching circuit 423, the difference between any two adjacent tune voltages (e.g., the tune voltages Vtune1 and Vtune2, or the tune voltages Vtune2 and Vtune3) among the set of tune voltages {Vtune} (e.g., the tune voltages Vtune1, Vtune2 and Vtune3) is equal to the predetermined voltage difference, while the active units 610 being dynamically selected from the series of varactor units within the core circuit 400C as shown in FIG. 6 in accordance with the digital code Con_Segment [n] (e.g., the digital code Con_Segment [n] obtained from the digital LF output such as the Digital LFOUT as shown in FIG. 4) as if the active units 610 are dynamically sliding through the series of varactor units within the core circuit 400C. As shown in the right half part of FIG. 7, a series of curves related to the multiple-voltage linearization (e.g., the multi-Vtune linearization such as the 3-Vtune linearization) at the active units 610 can be illustrated on a series of |dC/dV| to Vtune plots that are horizontally shifted, respectively, for indicating the varactor gains of the series of varactor units within the core circuit 400C, respectively. The overall gain provided by at least one portion (e.g., a portion or all) of the series of varactor units within the core circuit 400C can be expressed with a corresponding curve (labeled "Total") on a |dC/dV| to LFOUT plot as shown in the lower right part of FIG. 7, with the horizontal axis and the vertical axis representing the Digital LFOUT and the gain (or |dC/dV|), respectively, for indicating the summation of the respective varactor gains of the aforementioned at least one portion (e.g., a portion or all) of the series of varactor units. Taking the contribution of the associated curves in the frame 702 that is aligned to the reference line 701 as an example, the active units 610 and at least two adjacent units among the series of varactor units within the core circuit 400C can be configured to contribute the multiple-voltage linearization at the active units 610, and therefore, the overall gain on the |dC/dV| to LFOUT plot can be regarded as linearized.

Figure 8:
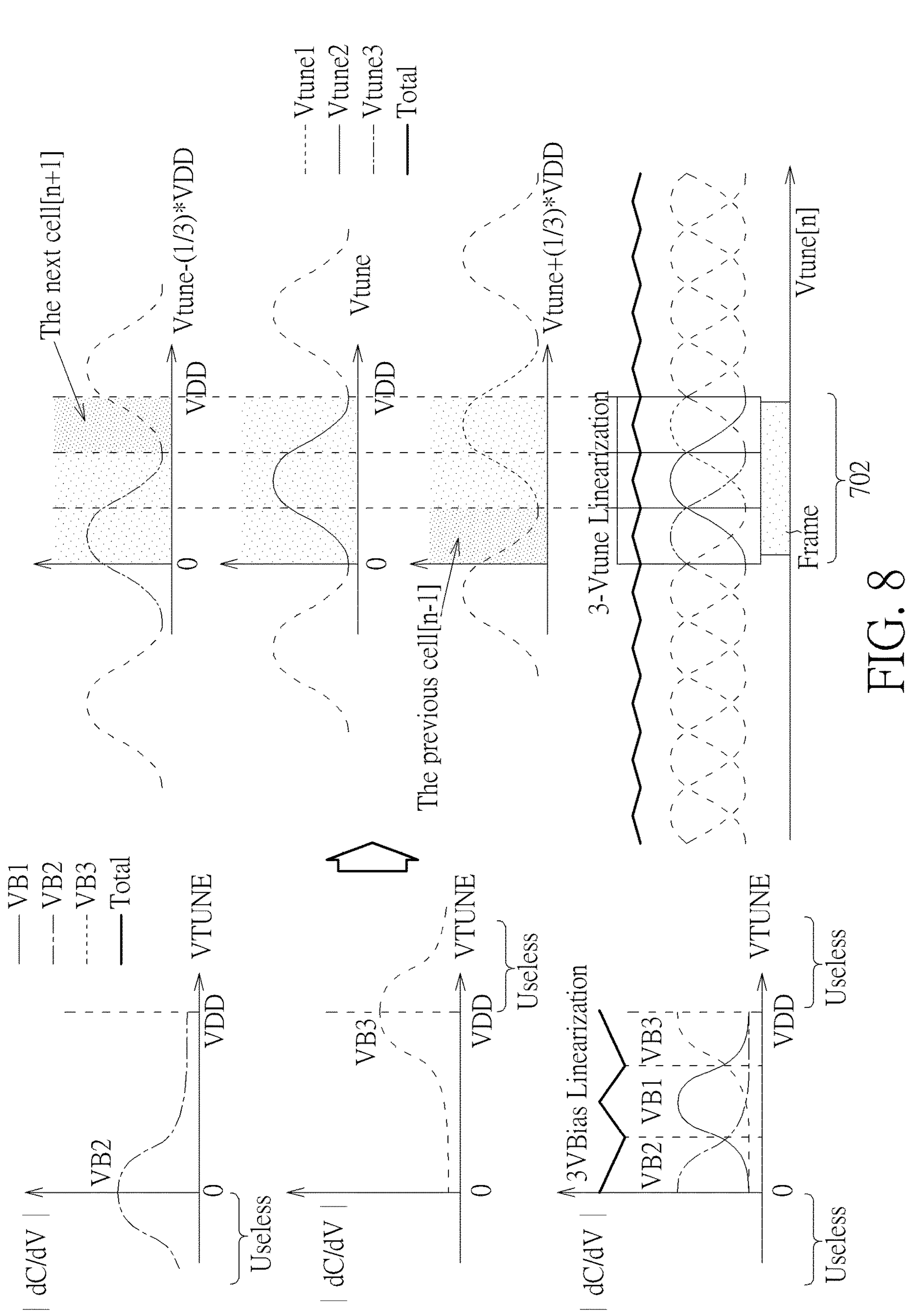
FIG. 8 illustrates, in the right half part thereof, some curves involved with the multi-tune-voltage control scheme shown in FIG. 6 according to an embodiment of the present invention, where some curves involved with in the multi-bias-voltage control scheme shown in FIG. 6 may be illustrated in the left half part of FIG. 8 for better comprehension.

FIG. 8 illustrates, in the right half part thereof, some curves involved with the multi-Vtune control scheme shown in FIG. 6 according to an embodiment of the present invention, where some curves involved with in the multi-Vbias control scheme shown in FIG. 6 may be illustrated in the left half part of FIG. 8 for better comprehension. Based on the multi-Vbias control scheme, taking the 3-Vbias linearization as an example of the multi-Vbias linearization, when considering the varactor unit/cell biased by the bias voltages VB2 and VB3, a significant portion of the curve corresponding to the bias voltage VB2 and a significant portion of the curve corresponding to the bias voltage VB3 are out of the useable range and are considered as useless, in particular, the varactor units/cells respectively biased by the bias voltages VB2 and VB3 cannot fully use their own capacitance (cap) variable ranges, and therefore the architecture of the multi-Vbias control scheme is less efficient in utilizing the capacitance variable ranges. Based on the multi-Vtune control scheme, taking the 3-Vtune linearization as an example of the multi-Vtune linearization, a certain active unit among the active units 610, such as the cell Cell[n] that is biased by the tune voltage Tune2, as well as the other active units among the active units 610, such as the previous cell Cell[n-1] and the next cell Cell[n+1] (respectively labeled "The previous cell [n−1]" and "The next cell [n+1]" for brevity) that are biased by the tune voltages Vtune1 and Vtune3, can be configured to contribute the multiple-voltage linearization at the active units 610. In addition, the active units 610 and the aforementioned at least two adjacent units among the series of varactor units within the core circuit 400C can be configured to contribute the multiple-voltage linearization at the active units 610, and therefore, the overall gain on the |dC/dV| to LFOUT plot can be regarded as linearized.

The proposed DCO (e.g., the DCO 100 shown in FIG. 2, such as the DCO 400) can operate according to the multi-Vtune control scheme for the varactor linearization to achieve the following advantages:

(1) Better area efficiency and/or lower parasitic capacitance (cap): full range of each varactor cell is used;

(2) More effective linearization: more useful CV curves are incorporated to linearize the varactor;

(3) Less gain variation over process variation: only one (1) Vbias is needed for the multi-Vtune control scheme (or "the multi-Vtune method"); and (4) Lower Vbias noise modulation gain: this will be explained in the following.

Figure 9:
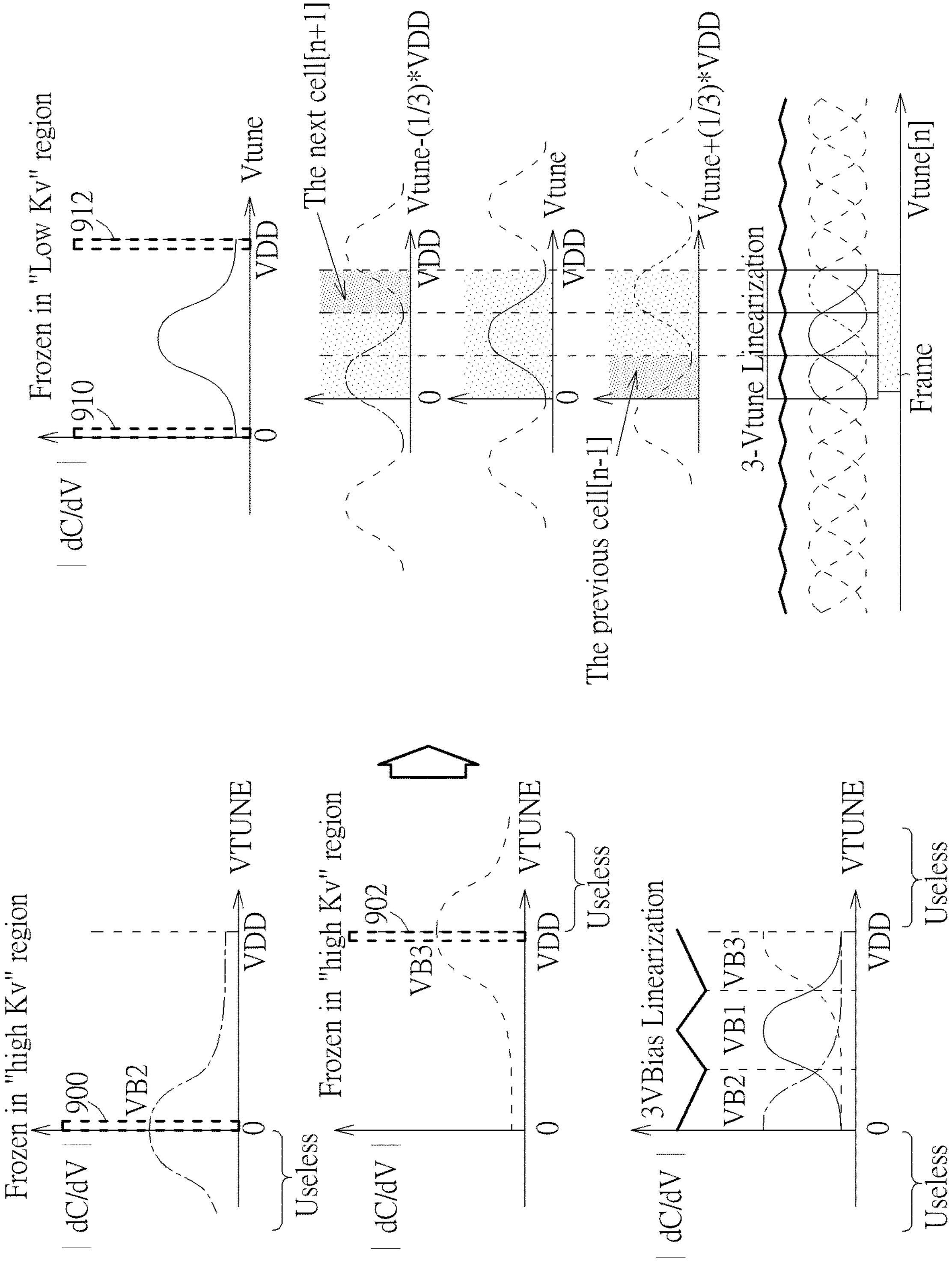
FIG. 9 illustrates, in the right half part thereof, the frozen regions involved with the multi-tune-voltage control scheme shown in FIG. 6 according to an embodiment of the present invention, where the frozen regions involved with in the multi-bias-voltage control scheme shown in FIG. 6 may be illustrated in the left half part of FIG. 9 for better comprehension.

FIG. 9 illustrates, in the right half part thereof, the frozen regions 910 and 912 involved with the multi-Vtune control scheme shown in FIG. 6 according to an embodiment of the present invention, where the frozen regions 900 and 902 involved with in the multi-Vbias control scheme shown in FIG. 6 may be illustrated in the left half part of FIG. 9 for better comprehension. Based on the multi-Vbias control scheme, taking the 3-Vbias linearization as an example of the multi-Vbias linearization, the multi-Vbias cell biased by the bias voltage VB2 may be frozen in a "high Kv" region such as the frozen region 900, and the multi-Vbias cell biased by the bias voltage VB3 may also be frozen in a "high Kv" region such as the frozen region 902. The CV curves of the multi-Vbias cells are shifted with the bias voltages {VB}. When the multi-Vbias cells are frozen (for example, in a situation where Vtune=0 or Vtune=VDD), they will be in the high Kv region, causing the overall performance to be degraded. More particularly, the bias voltage noise (or "the VB voltage noise") of the multi-Vbias cells will be converted to the phase noise with high Kv. In contrast, based on the multi-Vtune control scheme, taking the 3-Vtune linearization as an example of the multi-Vtune linearization, an active unit among the active units 610 may be frozen in "low Kv" regions such as the frozen regions 910 and 912, rather than any high Kv" region, and therefore, the proposed DCO (e.g., the DCO 100 shown in FIG. 2, such as the DCO 400) operating according to the multi-Vtune control scheme can achieve much better overall performance.

Figure 10:
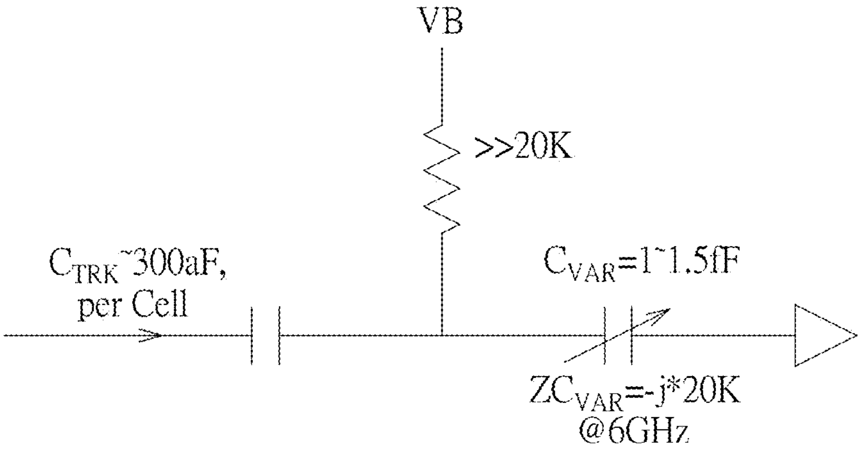
FIG. 10 illustrates an example of a high-resistance biasing resistor in an individual biasing resistor control scheme.

FIG. 10 illustrates an example of a high-resistance biasing resistor in an individual biasing resistor control scheme (referred to as the individual biasing R control scheme hereinafter). Because of about one hundred varactor cells, the biasing resistor (referred to as the biasing R hereinafter) will occupy a large area. Typically, a high-resistance biasing R having a high resistance that is much greater than 20 kilo-Ohm (kΩ, labeled "K" in some figures such as FIG. 10, etc. for brevity) is needed to avoid the $C_{TRK}$ gain degradation. For example, $C_{TRK}$ may be approximately equal to 300 attofarad (aF) per cell, and the variable capacitance $C_{VAR}$ may vary from 1 femtofarad (fF) to 1.5 fF, with $ZC_{VAR}$=−j*20K at (@) 6 GHz. The propose bridge biasing resistor (referred to as the bridge biasing R hereinafter) in the subsequent embodiments can solve this issue efficiently.

Figure 11:
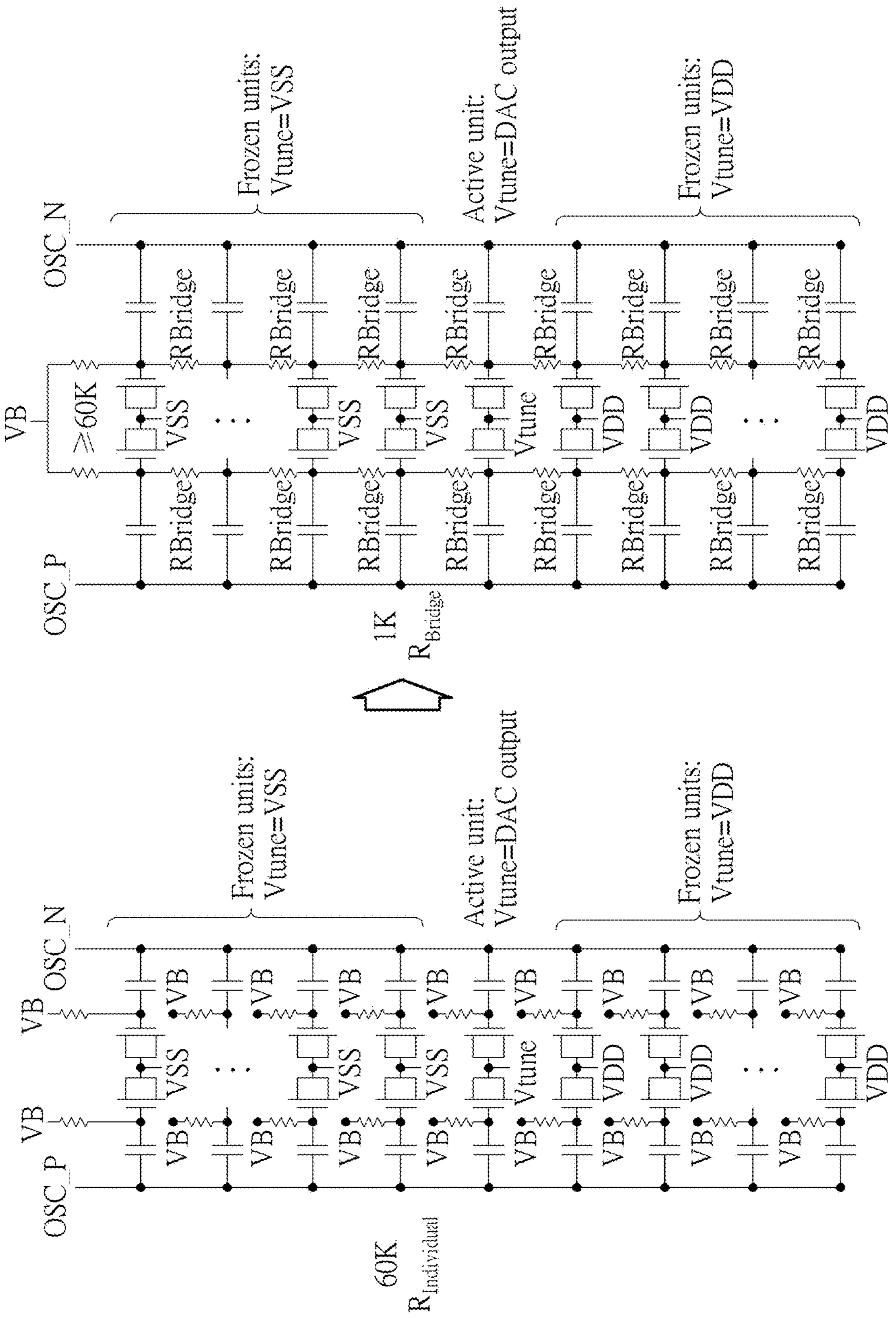
FIG. 11 illustrates, in the right half part thereof, a resistor configuration of a bridge biasing resistor control scheme of the operation method of the proposed DCO according to an embodiment of the present invention, where a resistor configuration of the individual biasing resistor control scheme may be illustrated in the left half part of FIG. 11 for better comprehension.

FIG. 11 illustrates, in the right half part thereof, a resistor configuration of a bridge biasing resistor control scheme (referred to as the bridge biasing R control scheme hereinafter) of the operation method of the proposed DCO according to an embodiment of the present invention, where a resistor configuration of the individual biasing R control scheme may be illustrated in the left half part of FIG. 11 for better comprehension. Based on the individual biasing R control scheme, there is the difficulty: How to bias all the tracking bank varactors without (w/o) degradation due to finite impedance of the biasing R. The impedance of the individual biasing R affects the $C_{TRK}$ significantly. As a result, the individual biasing R R_individual (denoted with "$R_{Individual}$") having a high resistance that is greater than 60 kΩ (labeled "60K" for brevity) is needed, leading to an unwanted design. Based on the bridge biasing R control scheme, the advantages of utilizing the bridge biasing R (denoted with RBridge) at least comprise: low resistance is enough. In addition, the resistors can be in different resistance. For example, the bridge biasing R may have a low resistance of 1 kΩ (labeled "1K" for brevity). As shown in the right half part of FIG. 11, the resistors between any two adjacent varactor units/cells in this architecture can be the bridge biasing resistors having the low resistance of 1 kΩ (labeled "RBridge" for brevity), while the resistors above all varactor units/cells in this architecture can have a high resistance that is greater than or equal to 60 kΩ (labeled "≥60K" for brevity), and can be regarded as shared biasing resistors that are shared by all varactor units/cells.

Figure 12:
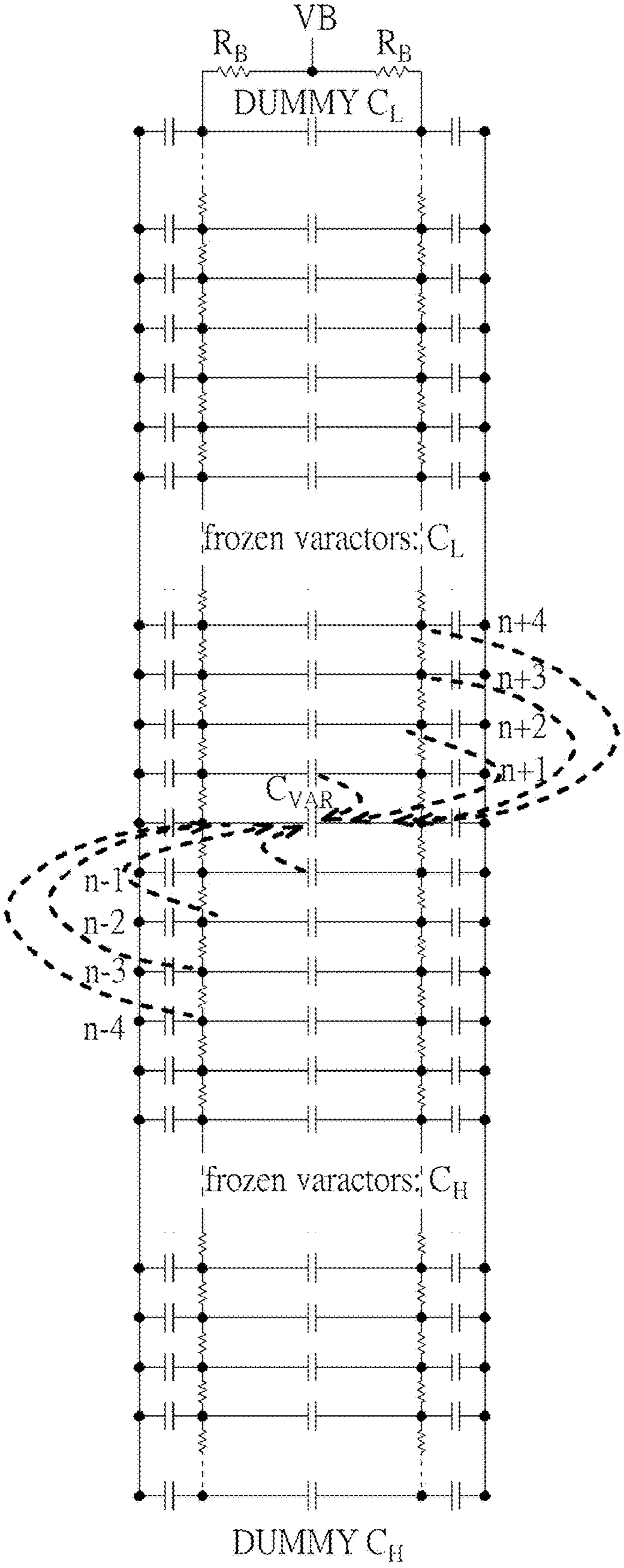
FIG. 12 illustrates the associated varactors involved with the bridge biasing resistor control scheme shown in FIG. 11 according to an embodiment of the present invention.

FIG. 12 illustrates the associated varactors involved with the bridge biasing R control scheme shown in FIG. 11 according to an embodiment of the present invention, where the circuit shown in FIG. 12 can be taken as an example of the equivalent circuit of the proposed segmented varactor bank with the bridge biasing R. With the RBridge, the $C_{TRK}$ will be affected by the adjacent varactor cells, and one or more weight functions {Weight_Function} of $C_{TRK}$ estimation can be used in the bridge biasing R control scheme. For example, with the bridge biasing R having low resistance of 1 kΩ (i.e., R=1K), the $C_{TRK}$ dominant contribution cells are only around (n+5) to (n−5), in particular, the range of the cell Cell[n+5] to the cell Cell[n−5] with respect to the cell Cell[n]. For example, for the variable capacitance $C_{VAR}$ at the cell Cell[n], a narrower range of the $C_{TRK}$ dominant contribution cells may comprise the upper cells Cell[n+4], Cell[n+3], Cell[n+2] and Cell[n+1] as well as the lower cells Cell[n−1], Cell[n−2], Cell[n−3] and Cell[n−4], which may affect the cell Cell[n] as indicated by the arrows depicted with dashed lines. In addition, with the operation pattern of the segmented tracking bank and the weight function Weight_Function, the $C_{TRK}$ will be constant across cells. Additionally, as shown in FIG. 12, the frozen varactors may comprise the upper frozen varactors at the VL side of the predetermined voltage VL such as the ground voltage VSS, with the capacitance $C_L$, and the lower frozen varactors at the VH side of the predetermined voltage VH such as the power voltage VDD, with the capacitance $C_H$.

Figure 13:
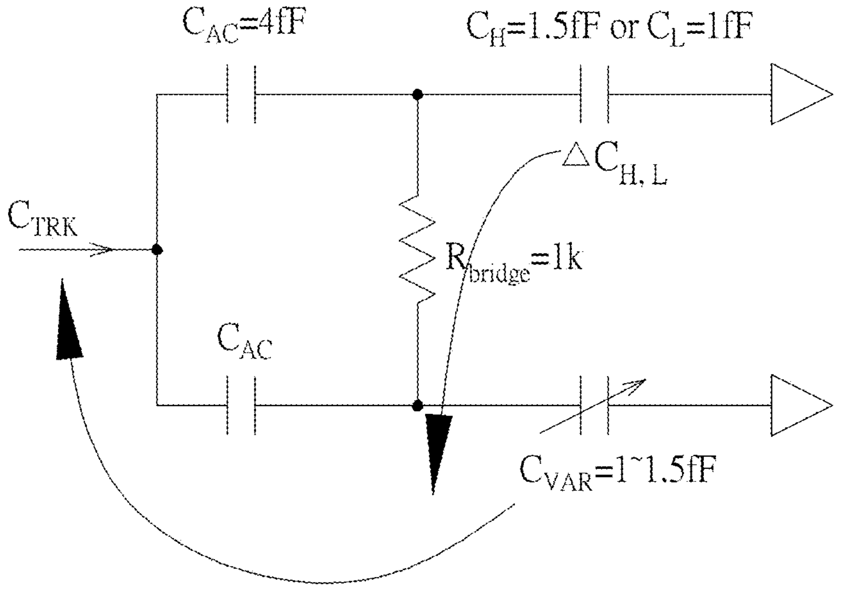
FIG. 13 illustrates an example of a low-resistance biasing resistor in the bridge biasing resistor control scheme shown in FIG. 11 according to an embodiment of the present invention.

FIG. 13 illustrates an example of a low-resistance biasing resistor (referred to as the low-resistance biasing R hereinafter) in the bridge biasing R control scheme shown in FIG. 11 according to an embodiment of the present invention. For example, the AC coupled capacitance CAC may be equal to 4 fF, the capacitance $C_H$ may be equal to 1.5 fF or the capacitance $C_L$ may be equal to 1 fF, and the variable capacitance $C_{VAR}$ may vary from 1 fF to 1.5 fF, with the associated capacitance difference being denoted as $\Delta C_{H,L}$.

Figure 14:
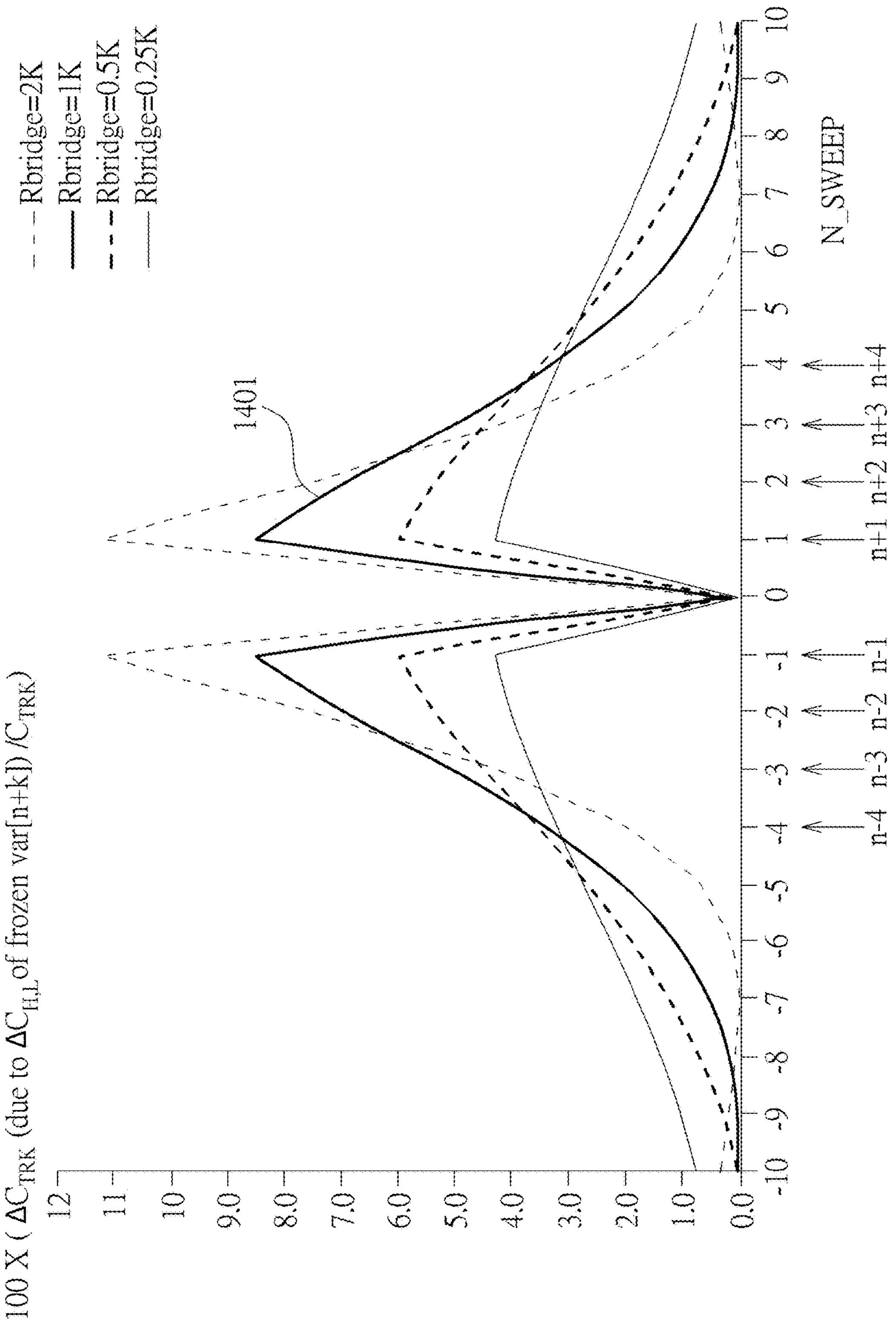
FIG. 14 illustrates some weight functions among a series of weight functions of adjacent cells in the bridge biasing resistor control scheme shown in FIG. 11 according to an embodiment of the present invention.

FIG. 14 illustrates some weight functions among a series of weight functions {Weight_Function(1), Weight_Function (2), . . . } of adjacent cells in the bridge biasing R control scheme shown in FIG. 11 according to an embodiment of the present invention. The horizontal axis may represent the Number of Sweep, N_SWEEP, with respect to the cell Cell[n], and the vertical axis may represent the ratio of the $C_{TRK}$ variation $\Delta C_{TRK}$ due to the capacitance difference $\Delta C_{H,L}$ of the frozen varactor var [n+k]) to the $C_{TRK}$, multiplied with one hundred to express as in unit of % (labeled "100×($\Delta C_{TRK}$ (due to $\Delta C_{H,L}$ of frozen var [n+k])/$C_{TRK}$)" for brevity). For better comprehension, the Number of Sweep N_SWEEP may be measured starting from the cell Cell[n], with the location of the cell Cell[n] being regarded as the origin, and therefore, the positive integer values {1, 2, 3, 4, . . . } may correspond to the locations of the upper cells Cell[n+1], Cell[n+2], Cell[n+3], Cell[n+4], etc., and the negative integer values {−1, −2, −3, −4, . . . } may correspond to the locations of the lower cells Cell[n−1], Cell[n−2], Cell[n−3], Cell[n−4], etc. The one or more weight functions {Weight_Function} may comprise the series of weight functions {Weight_Function(1), Weight_Function (2), . . . } respectively corresponding to various candidate resistance values of the RBridge, such as the four weight functions respectively corresponding to 2 kΩ, 1 kΩ, 0.5 kΩ and 0.25 kΩ (respectively labeled "Rbridge=2K", "Rbridge=1K", "Rbridge=0.5K" and "Rbridge=0.25K" for brevity). For example, in response to the selection of a certain candidate resistance value (e.g., 1 kΩ) of the RBridge, a corresponding weight function Weight_Function( ) (e.g., the weight function 1401) may be selected.

Figure 15:
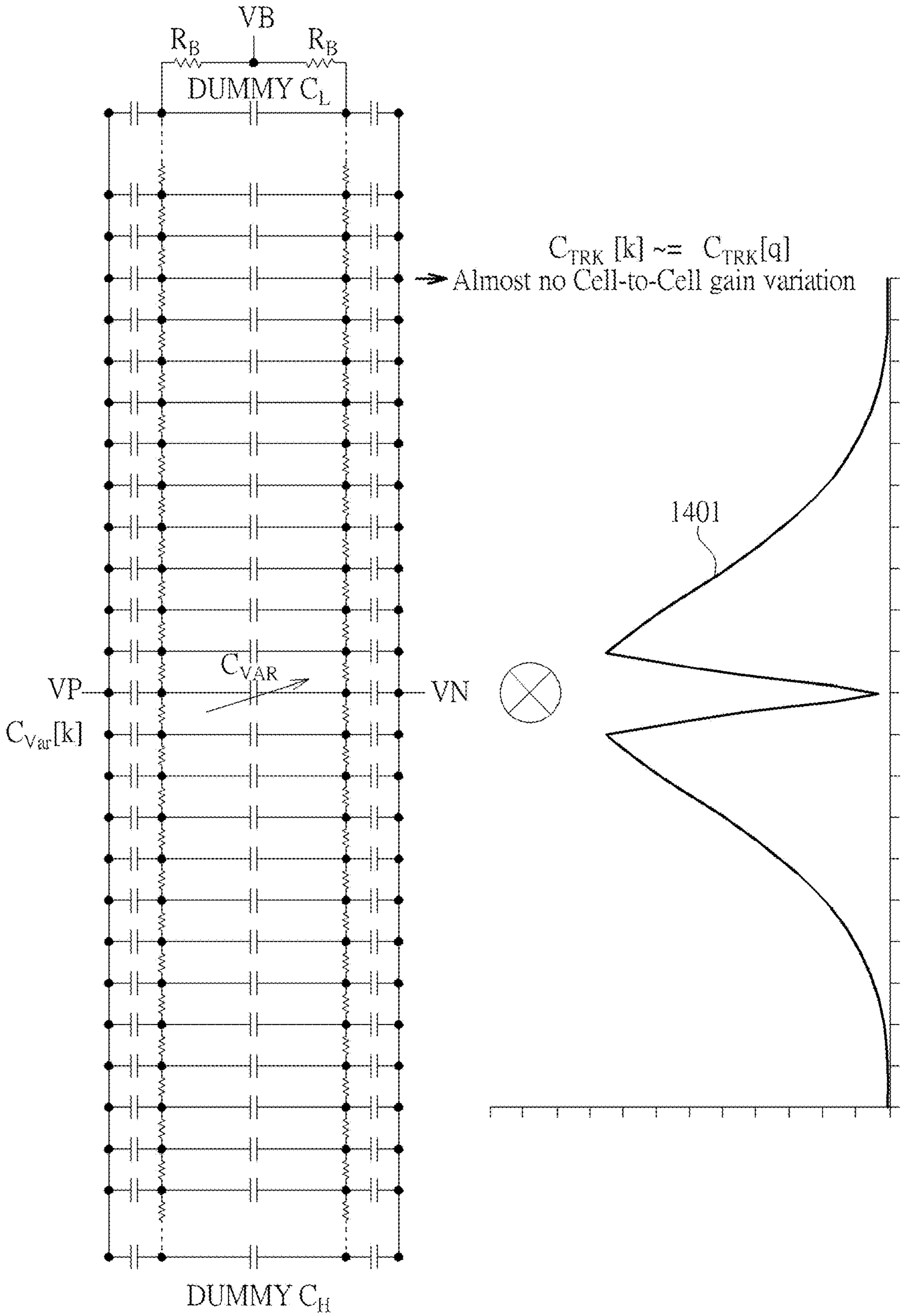
FIG. 15 illustrates a first multiplying operation with a weight function in the bridge biasing resistor control scheme shown in FIG. 11 according to an embodiment of the present invention.

FIG. 15 illustrates a first multiplying operation with a weight function (e.g., the weight function 1401) in the bridge biasing R control scheme shown in FIG. 11 according to an embodiment of the present invention. The $C_{TRK}$ of the cell Cell[n] (denoted as "$C_{TRK}$ [n]") can be equal to the summation of the $C_{TRK}$ contributed by the active units/cells (denoted as "$C_{TRK\_active}$") and the capacitance of the frozen units/cells Cell[n−m] (denoted as "Frozen_$C_{H,L}$[n−m]) multiplied by the corresponding weight function Weight_Function( ) such as the weight function 1401 (i.e., $C_{TRK}$ [n]=$C_{TRK\_active}$+Frozen_$C_{H,L}$ [n−m]×Weight_Function( ), where the $C_{TRK}$ [n] will be constant. To solve the boundary case, it is suggested to just simply add a predetermined number of dummy cells (labeled "DUMMY $C_L$" and "DUMMY $C_H$" at the upper side and the lower side respectively for brevity), such as five to six dummy cells. For example, the two upper resistors coupled in series, having the central node for receiving the bias voltage VB, can be referred to as the resistors {$R_B$}, and the voltages of the first and the second oscillation nodes OSC_P and OSC_N can be referred to as the voltages VP and VN, respectively. The variable capacitance $C_{VAR}$ of the cell Cell[k] can be denoted as $C_{Var}$[k]. As $C_{TRK}$ [k]~=$C_{TRK}$[q], there is almost no cell-to-cell gain variation. For brevity, similar descriptions for this embodiment are not repeated in detail here.

Figure 16:
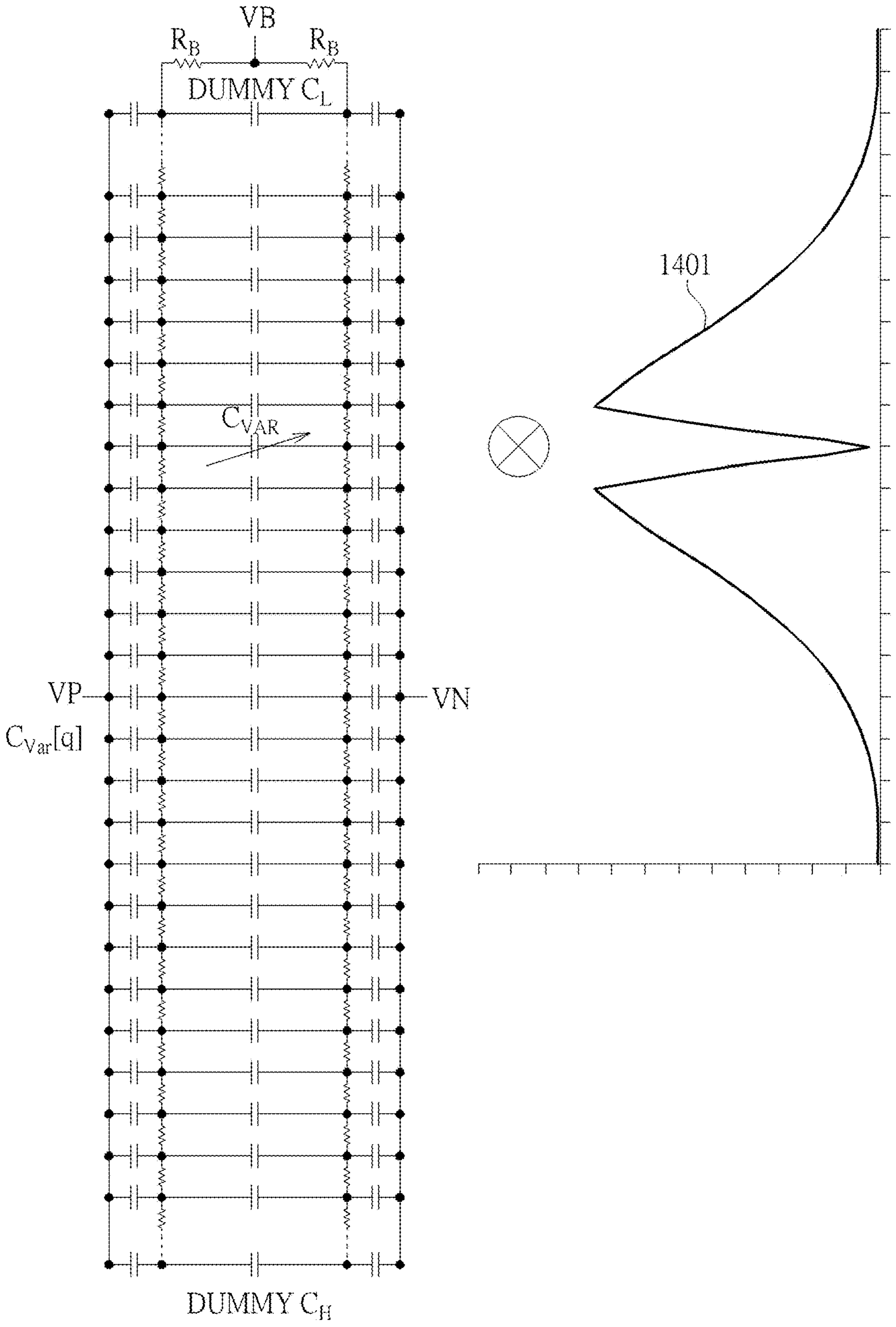
FIG. 16 illustrates a second multiplying operation with the weight function in the bridge biasing resistor control scheme shown in FIG. 11 according to an embodiment of the present invention.

FIG. 16 illustrates a second multiplying operation with the weight function (e.g., the weight function 1401) in the bridge biasing R control scheme shown in FIG. 11 according to an embodiment of the present invention. The variable capacitance $C_{VAR}$ of the cell Cell[q] can be denoted as $C_{Var}$[q]. For brevity, similar descriptions for this embodiment are not repeated in detail here.

Figure 17:
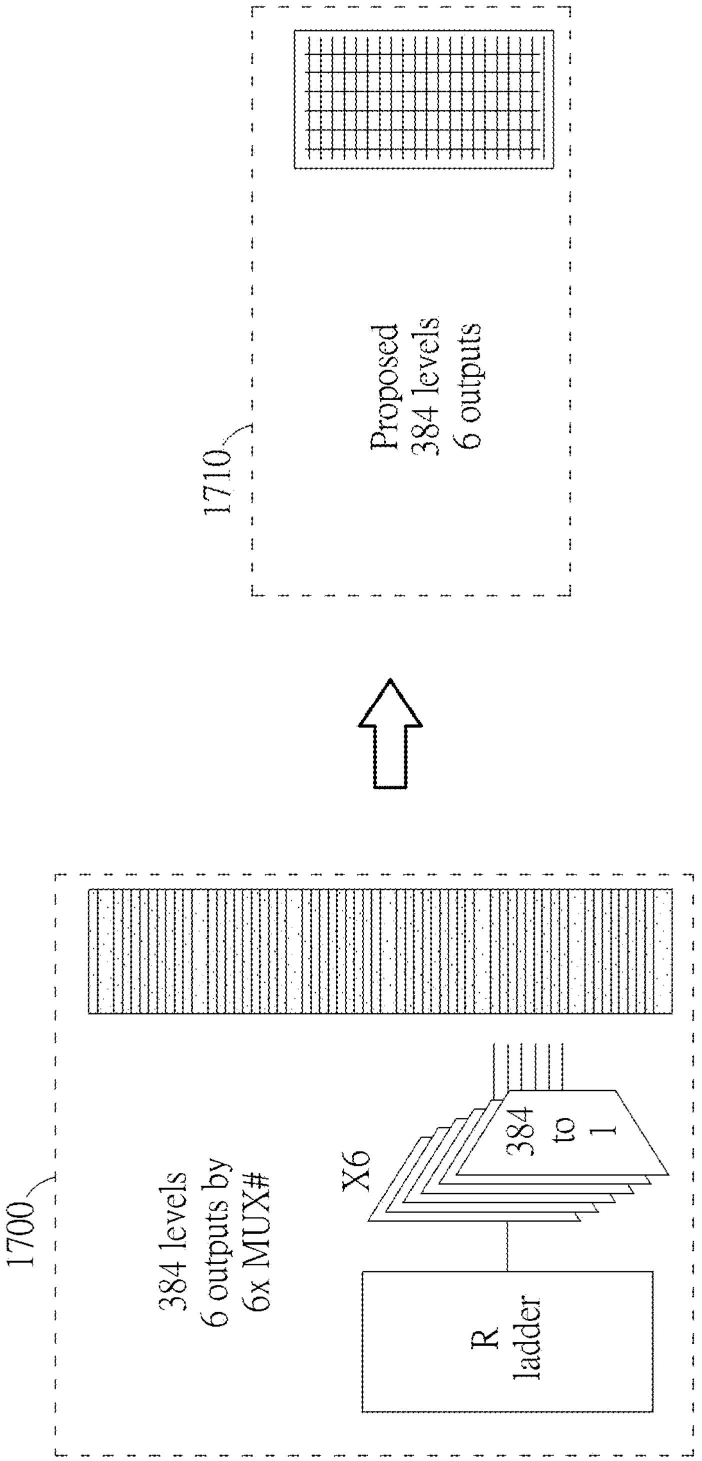
FIG. 17 illustrates, in the right half part thereof, an area-efficient DAC MUX array control scheme of the operation method of the proposed DCO according to an embodiment of the present invention, where a non-area-efficient DAC MUX array control scheme may be illustrated in the left half part of FIG. 17 for better comprehension.

FIG. 17 illustrates, in the right half part thereof, an area-efficient DAC MUX array control scheme 1710 of the operation method of the proposed DCO according to an embodiment of the present invention, where a non-area-efficient DAC MUX array control scheme 1700 may be illustrated in the left half part of FIG. 17 for better comprehension. The proposed multi-Vtune method such as the 3-Vtune method with the complementary DAC outputs leads to 6 DAC outputs. Based on the non-area-efficient DAC MUX array control scheme 1700, a resistor ladder (referred to as the R ladder hereinafter) such as a 384 level R ladder (referred to as the 384 R ladder hereinafter) may be configured to generate 384 levels, and the R-DAC of the non-area-efficient DAC MUX array control scheme 1700 may generate the 6 outputs selected from the 384 levels by six times the number of MUXs (labeled "384 levels 6 outputs by 6×MUX #" for brevity). For example, when a 384 to 1 MUX circuit (labeled "384 to 1" for brevity) is arranged to select one of the 384 levels to be one of the 6 outputs, the R-DAC of the non-area-efficient DAC MUX array control scheme 1700 should be equipped with six 384 to 1 MUX circuits. Based on the area-efficient DAC MUX array control scheme 1710, in the proposed R-DAC (e.g., the R-DAC 121 such as the R-DAC 421), the proposed area-efficient DAC MUX array can utilize the two (2) layers (2-layers) MUXs therein to generate the basic output pattern with the first (1st) layer (1st-layer) MUXs and synthesize the 6 DAC outputs by the second (2nd) layer (2nd-layer) MUXs, for generating the 6 outputs selected from the 384 levels by a smaller number of MUXs (labeled "Proposed 384 levels 6 outputs" for brevity).

Figure 18:
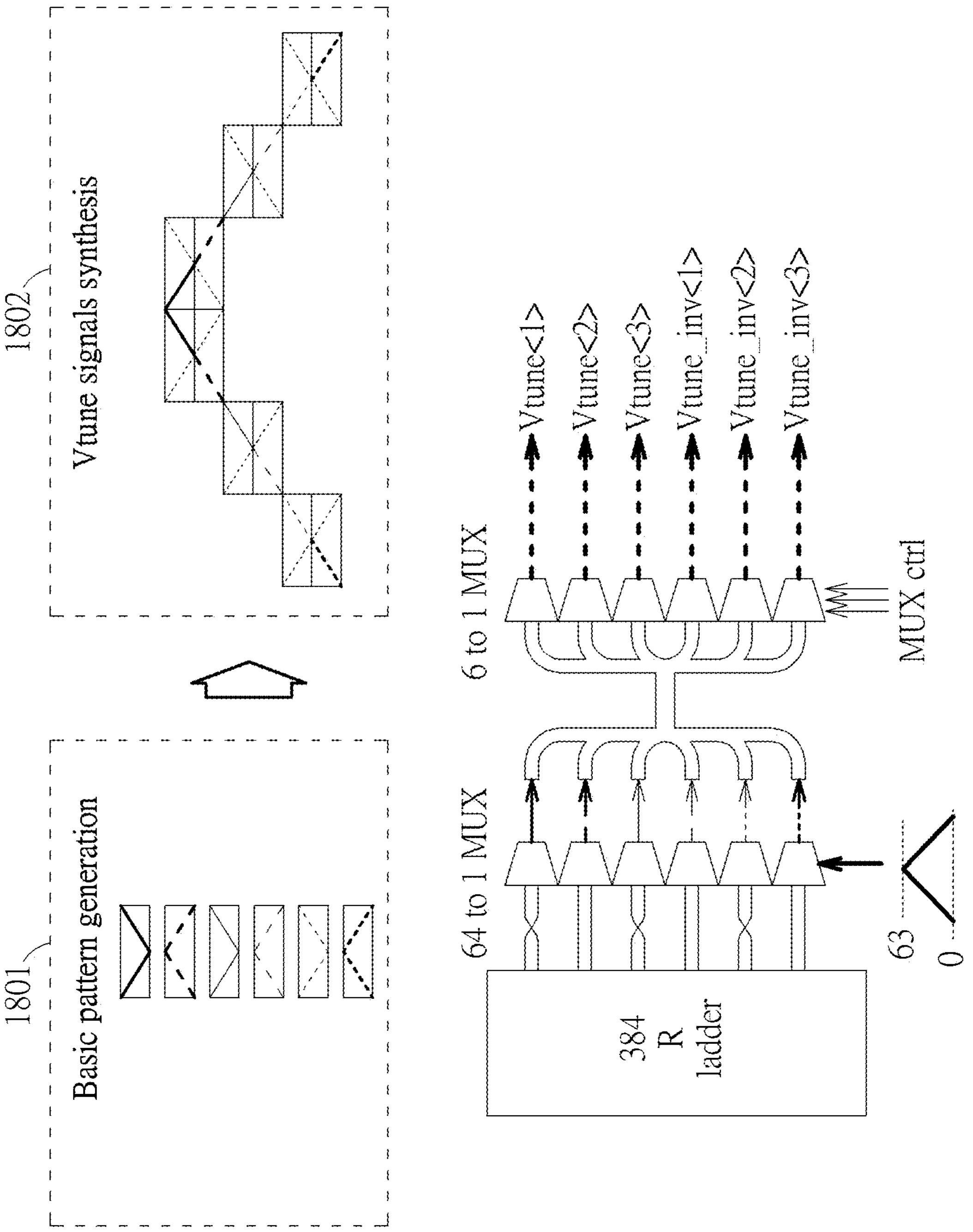
FIG. 18 illustrates the basic pattern generation and the Vtune signals synthesis in the area-efficient DAC MUX array control scheme shown in FIG. 17 according to an embodiment of the present invention.

FIG. 18 illustrates the basic pattern generation 1801 and the Vtune signals synthesis 1802 in the area-efficient DAC MUX array control scheme shown in FIG. 17 according to an embodiment of the present invention, where the circuit architecture shown in the lower half part of FIG. 18 can be taken as an example of the proposed area-efficient DAC MUX array. The proposed R-DAC (e.g., the R-DAC 121 such as the R-DAC 421) can use the 1$^{st}$ layer MUXs to generate the basic output pattern during the basic pattern generation 1801, and use the 2$^{nd}$ layer MUXs to reconstruct the required 6-output waveforms during the Vtune signals synthesis 1802. As there are three sets of complementary outputs, the proposed R-DAC (e.g., the R-DAC 121 such as the R-DAC 421) can prevent glitches. In addition, the 6-output DAC area overhead is only 30%.

As shown in the lower half part of FIG. 18, the 1$^{st}$ layer MUXs may comprise six 64 to 1 MUXs, for multiplexing six sets of 64 levels (i.e., a first set of 64 levels to a sixth set of 64 levels, counting from the bottommost set to the topmost set), such as the (64*6) levels {{L1, L2, . . . , L64}, {L65, L66, . . . , L128}, . . . , {L321, L322, . . . , L384}}, respectively. The second set of 64 levels, the fourth set of 64 levels and the sixth set of 64 levels may be inverted as illustrated with the second, the fourth and the sixth waveforms among the first to the sixth waveforms (counting from the bottommost waveform to the topmost waveform) shown in the basic pattern generation 1801, for being input into the three corresponding 64 to 1 MUXs in the inverted waveform manner (illustrated with the flipped bands of levels between the 384 R ladder and the three corresponding 64 to 1 MUXs for indicating that they correspond to the second, the fourth and the sixth waveforms, respectively). In addition, the 2$^{nd}$ layer MUXs may comprise six 6 to 1 MUXs, for multiplexing the six MUX outputs from the six 64 to 1 MUXs of the 1$^{st}$ layer MUXs according to the MUX control signals (labeled "MUX ctrl" for brevity) in order to output the tune voltages {Vtune} such as the tune voltages Vtune<1>, Vtune<2>, Vtune<3>, Vtune_inv <1>, Vtune_inv<2> and Vtune_inv<3> in accordance with the first to the sixth waveforms (counting from the leftmost waveform to the rightmost waveform) shown in the Vtune signals synthesis 1802, for being used as the DAC output voltages VT1, VT2, VT3, VT1C, VT2C and VT3C, respectively.

Figure 19:
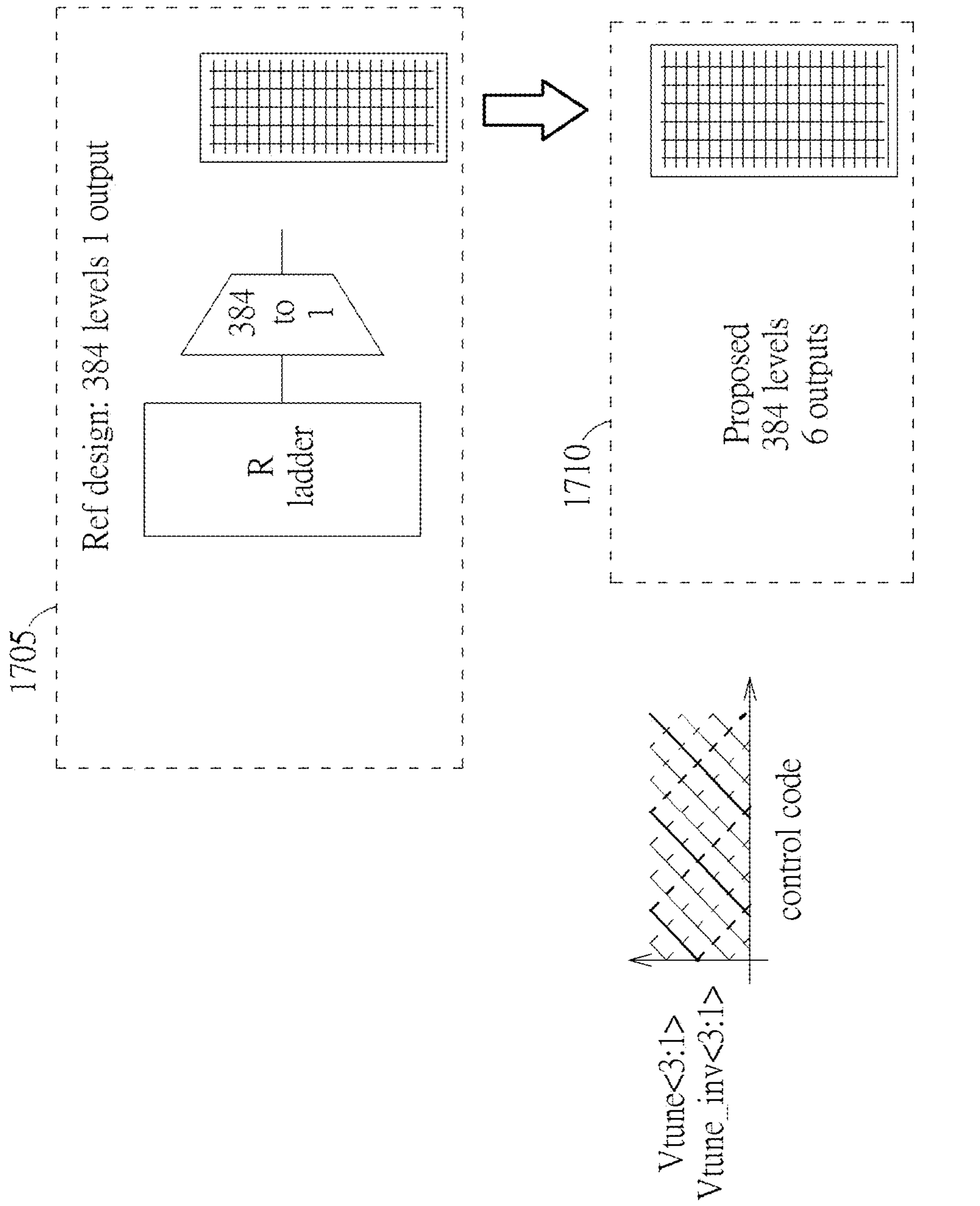
FIG. 19 illustrates some implementation details of the area-efficient DAC MUX array control scheme shown in FIG. 17 according to an embodiment of the present invention.

FIG. 19 illustrates some implementation details of the area-efficient DAC MUX array control scheme shown in FIG. 17 according to an embodiment of the present invention. The area-efficient DAC MUX array control scheme 1710 can be implemented by way of extending the reference design 1705 for generating one output selected from the 384 levels (labeled "384 levels 1 outputs" for brevity) by one 384 to 1 MUX circuit (labeled "384 to 1" for brevity). In response to the control code carried by the MUX control signals mentioned above, the $2^{nd}$ layer MUXs (or the six 6 to 1 MUXs therein) can output the tune voltages {Vtune} such as the tune voltages Vtune<1>, Vtune<2>, Vtune<3>, Vtune_inv<1>, Vtune_inv<2> and Vtune_inv<3> in accordance with the first to the sixth waveforms (counting from the leftmost waveform to the rightmost waveform) shown in the Vtune signals synthesis 1802, for being used as the DAC output voltages VT1, VT2, VT3, VT1C, VT2C and VT3C, respectively. For brevity, similar descriptions for this embodiment are not repeated in detail here.

As shown in FIG. 17 and FIG. 19, the non-area-efficient DAC MUX array control scheme 1700, the reference design 1705 and the area-efficient DAC MUX array control scheme 1710 may be illustrated along with the zoom out versions of their MUXs circuits, respectively, for chip area comparison between them, respectively, but the present invention is not limited thereto. According to some embodiments, more diagrams of these MUXs circuits may be illustrated to indicate the associated implementation details.

Figure 20:
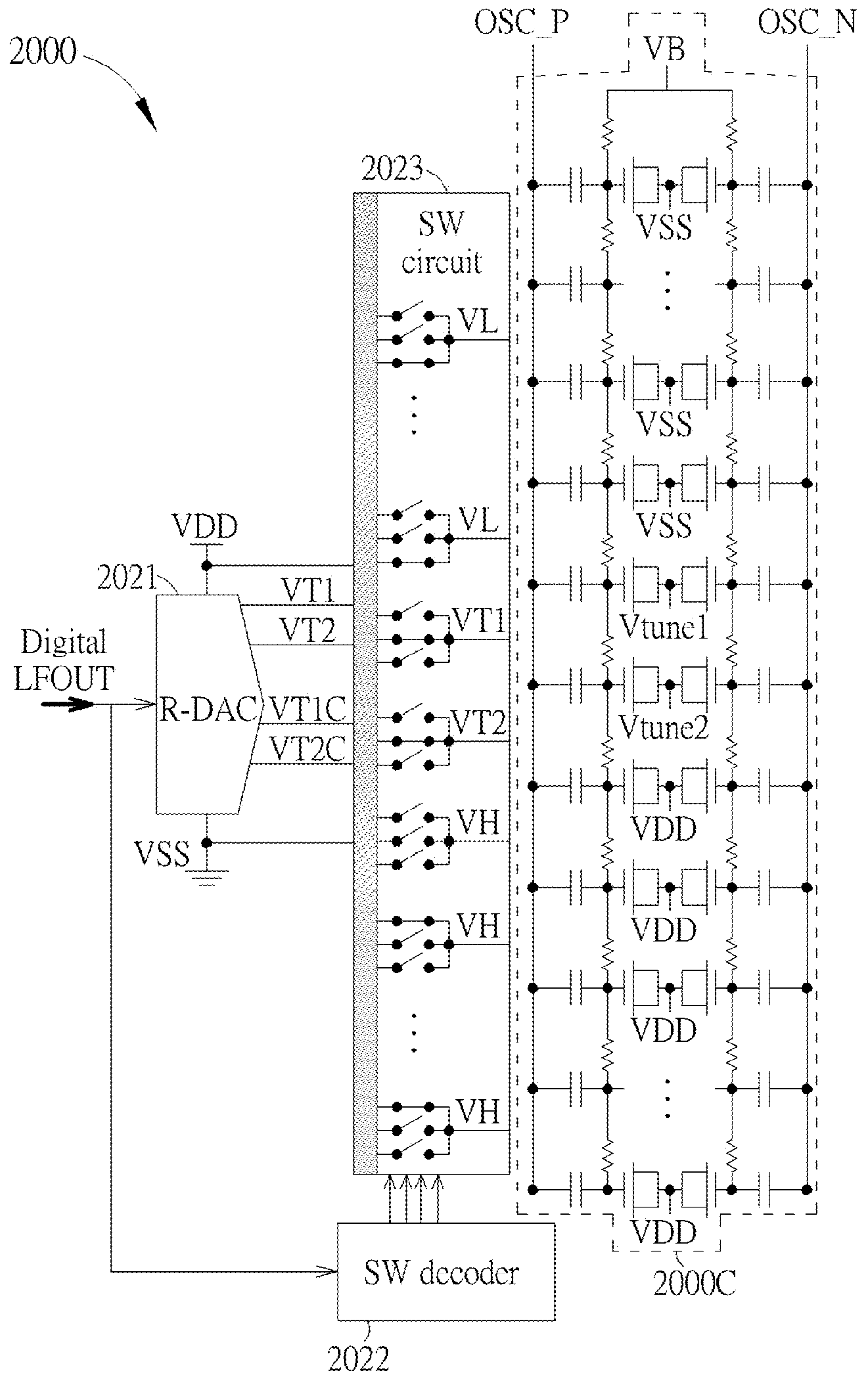
FIG. 20 is a diagram illustrating a DCO according to yet another embodiment of the present invention.

FIG. 20 is a diagram illustrating a DCO 2000 according to yet another embodiment of the present invention, where the DCO 2000 can be taken as an example of the DCO 100 shown in FIG. 2, and the core circuit 2000C, the R-DAC 2021, the switching decoder 2022 (labeled "SW decoder" for brevity), and the switching circuit 2023 (labeled "SW circuit" for brevity) within the DCO 2000 can be taken as examples of the core circuit 100C, the R-DAC 121, the switching decoder 122, and the switching circuit 123 within the DCO 100, respectively. For brevity, similar descriptions for this embodiment are not repeated in detail here.

According to some embodiments, the proposed DCO can use less or more tune voltages {Vtune}, depending on the design requirements, and the architecture of the main circuit such as the core circuit within the proposed DCO can be implemented in accordance with the corresponding Vtune design among various Vtune designs such as the 2-Vtune design, 3-Vtune design, 4-Vtune design, etc. For brevity, similar descriptions for these embodiments are not repeated in detail here.

According to some embodiments, the proposed DCO can use various bridge resistor grouping (in particular, sharing capacitor (cap) and resistor for one or more varactors), depending on the design requirements, and the architecture of the main circuit such as the core circuit within the proposed DCO can be implemented in accordance with the corresponding bridge resistor grouping design among various bridge resistor grouping designs. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digitally controlled oscillator (DCO) with segmented varactor bank and multiple-voltage linearization, the DCO comprising:

a varactor array, the varactor array comprising a plurality of varactors positioned in the segmented varactor bank, wherein the varactor array is composed of multiple varactor sets, any varactor set among the multiple varactor sets is composed of at least one varactor unit among multiple varactor units belonging to the multiple varactor sets, and any varactor unit among the multiple varactor units is composed of a pair of varactors among the plurality of varactors;

a plurality of bridge biasing resistors, positioned in the segmented varactor bank, configured to bridge the multiple varactor sets of the varactor array, for biasing the multiple varactor sets with a series of intermediate voltages within a predetermined biasing voltage range controlled by a predetermined biasing voltage;

a plurality of capacitors, coupled between the multiple varactor sets within the segmented varactor bank and a set of differential oscillation nodes of the DCO, configured as alternating current (AC) coupled capacitors between the multiple varactor sets and the set of differential oscillation nodes, wherein the any varactor set among the multiple varactor sets is coupled to the set of differential oscillation nodes via a set of AC coupled capacitors, respectively; and a negative transconductance ($g_m$) network ($-g_m$ network), coupled to the set of differential oscillation nodes, configured to sustain oscillation of a set of differential oscillation signals at the set of differential oscillation nodes;

wherein one set of varactor units and multiple remaining sets of varactor units among the multiple varactor units, the one set of varactor units and the multiple remaining sets of varactor units respectively belonging to at least one varactor set and remaining varactor sets among the multiple varactor sets, are configured as active units and frozen units to receive a set of tune voltages and a set of predetermined voltages, respectively, for providing the multiple-voltage linearization at the active units.

2. The DCO of claim 1, wherein the set of tune voltages comprise at least two tune voltages, and the set of predetermined voltages comprise a first predetermined voltage and a second predetermined voltage.

3. The DCO of claim 2, wherein the first predetermined voltage and the second predetermined voltage represent a power voltage and a ground voltage, respectively.

4. The DCO of claim 1, wherein any active unit among the active units is configured to receive one of the set of tune voltages via a central tuning node of the any active unit, and any frozen unit among the frozen units is configured to receive one of the set of predetermined voltages via a central tuning node of the any frozen unit.

5. The DCO of claim 1, further comprising:

a multi-output digital-to-analog converter (DAC) circuit, configured to generate multiple output voltages according to a digital code; and a switching circuit, coupled between the multi-output DAC circuit and the multiple varactor units, configured to perform switching operations on the multiple output voltages and the set of predetermined voltages, for providing the set of tune voltages and the set of predetermined voltages to the active units and the frozen units, respectively, wherein a set of output voltages among the multiple output voltages are used as the set of tune voltages.

6. The DCO of claim 5, wherein a voltage count of the multiple output voltages is a multiple of a voltage count of the set of output voltages.

7. The DCO of claim 6, wherein the multiple output voltages comprise the set of output voltages and a set of complementary output voltages that are complementary to the set of output voltages.

8. The DCO of claim 7, wherein a difference between any two adjacent output voltages among the set of output voltages is equal to a predetermined voltage difference, for achieving the multiple-voltage linearization at the active units, and a difference between any two adjacent complementary output voltages among the set of complementary output voltages is equal to the predetermined voltage difference, for achieving the multiple-voltage linearization at the active units.

9. The DCO of claim 5, further comprising:

a decoder, configured to decode the digital code to generate a decoded result, for controlling the switching operations;

wherein the switching circuit comprises:

multiple sets of switches, coupled to the multiple varactor units, respectively, configured to perform the switching operations according to the decoded result.

10. The DCO of claim 9, wherein the multiple varactor units are configured to dynamically change among roles of the active units and the frozen units with respect to the decoded result.

11. The DCO of claim 1, wherein the multiple varactor units are configured to dynamically change among roles of the active units and the frozen units.

12. The DCO of claim 1, wherein a difference between any two adjacent tune voltages among the set of tune voltages is equal to a predetermined voltage difference, for achieving the multiple-voltage linearization at the active units.

13. The DCO of claim 1, wherein the active units and at least two adjacent units among the multiple varactor units are configured to contribute the multiple-voltage linearization at the active units.

14. The DCO of claim 1, wherein the plurality of capacitors comprise multiple first capacitors and multiple second capacitors, configured as multiple first AC coupled capacitors and multiple second AC coupled capacitors, respectively; and the set of differential oscillation nodes comprise a first oscillation node and a second oscillation node, and the set of AC coupled capacitors comprise a first AC coupled capacitor among the multiple first AC coupled capacitors and a second AC coupled capacitor among the multiple second AC coupled capacitors, wherein the any varactor set among the multiple varactor sets is coupled to the first oscillation node and the second oscillation node via the first AC coupled capacitor and the second AC coupled capacitor, respectively.

15. A phase-locked loop (PLL) comprising the DCO of claim 1.

* * * * *